(12) United States Patent
Inagaki et al.

(10) Patent No.: US 7,571,759 B2
(45) Date of Patent: Aug. 11, 2009

(54) STACKED TYPE COOLER

(75) Inventors: Mitsuharu Inagaki, Kariya (JP); Motohiro Shirai, Kariya (JP)

(73) Assignee: DENSO Corporation, Kariya (JP)

( * ) Notice: Subject to any disclaimer, the term of this patent is extended or adjusted under 35 U.S.C. 154(b) by 721 days.

(21) Appl. No.: 11/001,509

(22) Filed: Dec. 1, 2004

(65) Prior Publication Data
US 2005/0121173 A1    Jun. 9, 2005

(30) Foreign Application Priority Data

| Dec. 3, 2003 | (JP) | 2003-404940 |
|---|---|---|
| Apr. 21, 2004 | (JP) | 2004-125461 |
| Aug. 31, 2004 | (JP) | 2004-252886 |

(51) Int. Cl.
F28F 7/00    (2006.01)

(52) U.S. Cl. .................. 165/80.4; 165/166; 165/177

(58) Field of Classification Search .............. 165/80.4, 165/166, 167, 177
See application file for complete search history.

(56) References Cited

U.S. PATENT DOCUMENTS

| 4,049,046 | A | * | 9/1977 | Worthington | 165/48.2 |
|---|---|---|---|---|---|
| 5,078,207 | A | * | 1/1992 | Asano et al. | 165/166 |
| 5,562,158 | A | * | 10/1996 | Nishishita | 165/153 |
| 6,542,365 | B2 | | 4/2003 | Inoue | |
| 6,635,360 | B2 | * | 10/2003 | Takeno et al. | 428/654 |
| 6,904,965 | B2 | * | 6/2005 | Beck et al. | 165/175 |
| 2001/0033477 | A1 | * | 10/2001 | Inoue et al. | 361/718 |
| 2002/0078566 | A1 | | 6/2002 | Torigoe et al. | |
| 2002/0101718 | A1 | | 8/2002 | Negishi et al. | |

(Continued)

FOREIGN PATENT DOCUMENTS

JP    03077776 A    *    4/1991

(Continued)

OTHER PUBLICATIONS

Office Action mailed Mar. 4, 2008 in corresponding Japanese Patent Application No. 2004-125461.

(Continued)

*Primary Examiner*—Ljiljana (Lil) V Ciric
(74) *Attorney, Agent, or Firm*—Harness, Dickey & Pierce, PLC

(57) ABSTRACT

A stacked type cooler 1 for cooling a plurality of electronic components 6 from two surfaces of each component includes a plurality of cooling tubes 2 having a flat shape and coolant flow passage 21 for allowing a coolant to flow, and a connecting pipe 3 for communicating these cooling tubes 2. The plurality of cooling tubes 2 is arranged and stacked in such a fashion as to interpose the electronic components 6 between the cooling tubes. The plurality of cooling tubes 2 includes an outside cooling tube 2b and an inside cooling tube 2a. The inside cooling tube 2a includes at least a first coolant flow passage 211 facing a first tube wall 231 constituting a first main surface 221 of the inside cooling tube 2a and a second coolant flow passage 212 facing a second tube wall 232 constituting a second main surface 222 on the opposite side to the first main surface 221. The coolant flow passage 21 is formed into two or more stages in a direction of thickness of the inside cooling tube 2a.

29 Claims, 17 Drawing Sheets

U.S. PATENT DOCUMENTS

2003/0090873 A1 5/2003 Ohkouchi
2004/0144996 A1 7/2004 Inoue

FOREIGN PATENT DOCUMENTS

| JP | 06-037219 | 2/1994 |
| JP | 06-120385 | 4/1994 |
| JP | JUMP-B-3010602 | 2/1995 |
| JP | 09-283679 | 10/1997 |
| JP | 10-298686 | 11/1998 |
| JP | 2001-50690 | 2/2001 |
| JP | 2001-320005 | 11/2001 |
| JP | 2002-009216 | 1/2002 |
| JP | 2002-026215 | 1/2002 |
| JP | 2002-98454 | 4/2002 |
| JP | 2002-364337 | 12/2002 |
| JP | 2002-368170 | 12/2002 |
| JP | 2003-007944 | 1/2003 |

OTHER PUBLICATIONS

U.S. Appl. No. 10/733,472, filed Dec. 12, 2003.
Office Action mailed Nov. 11, 2008 in corresponding Japanese Patent Application No. 2004-252886 with English Translation.

\* cited by examiner

STACKED TYPE COOLER

BACKGROUND OF THE INVENTION

1. Field of the Invention

This invention relates to a cooler for cooling electronic components that generate heat from two surfaces. The invention is particularly suitable as a cooler for cooling a double-faced cooling-type electronic component for an inverter in a hybrid electric car.

2. Description of the Related Art

As shown in FIGS. 20 and 21, in a stacked type cooler 9, available in the past, cooling tubes 92 are arranged in such a fashion as to sandwich a semiconductor module (electronic component) 91 between the two cooling tubes 92 in order to remove heat of the semiconductor modules 91 having built-in semiconductor devices (Japanese Unexamined Patent Publication No. 2002-26215).

This stacked type cooler 9 has a construction in which the semiconductor modules 91 and the cooling tubes 92 are alternately stacked. Cooling tubes 92 stacked in this way are connected with one another through connecting pipe 93 so that a coolant can flow through each cooling tube 92.

When a large difference of calorific amounts occurs between the semiconductor module 91 arranged on one of the surfaces of the cooling tube 92 and the semiconductor module 91 arranged on the other surface, however, heat is likely to transfer from one of the semiconductor module 91 to the other 91 through the cooling tube 92. Therefore, the temperature of the semiconductor module 91 having a smaller calorific amount is likely to be increased.

In consequence, the cooling capacity of the stacked type cooler is likely to become insufficient.

SUMMARY OF THE INVENTION

In view of the problems of the prior art described above, this invention aims at providing a stacked type cooler having an excellent cooling capacity.

It is another object of the invention to efficiently cool electronic components the heat radiation amounts of which are different between two surfaces.

According to one aspect of the invention, there is provided a stacked type cooler for cooling a plurality of electronic components at two surfaces thereof, including a plurality of cooling tubes having a flat shape and coolant flow passages for allowing a coolant to flow, and a connecting pipe for connecting the plurality of cooling tubes, wherein the plurality of cooling tubes are arranged and stacked in such a fashion as to alternately interpose the electronic components arranged alternately with the cooling tubes and include two outside cooling tubes arranged at both ends in a stacking direction and a plurality of inside cooling tubes arranged between the two outside cooling tubes; and the inside cooling tube includes at least a first coolant flow passage facing a first tube wall having a first main surface coming into contact with the electronic component and a second coolant flow passage facing a second tube wall having a second main surface coming into contact with the electronic component on the opposite side to the first main surface, and the coolant flow passages are formed in two or more stages in a direction of thickness of the inside cooling tube.

Next, the function and effect of the invention will be explained.

The coolant flow passage is formed inside cooling tube in two or more stages in a direction of thickness of the inside cooling tube, and the inside cooling tube has a first coolant flow passage and a second coolant flow passage. Therefore, the electronic component arranged in contact with the first main surface of the inside cooling tube can be cooled by the coolant flowing through the first coolant flow passage and the electronic component arranged in contact with the second main surface of the inside cooling tube can be cooled by the coolant flowing through the second coolant flow passage.

Therefore, even when the calorific amount of the electronic component arranged in contact with the first main surface (or second main surface) is great, the coolant receiving that heat does not flow towards the second main surface (or first main surface). Consequently, the temperature rise of the electronic component arranged in contact with the second main surface (or first main surface) can be prevented.

When the sectional area of the coolant flow passage is constant, the heat transfer area between the cooling tube and the coolant can be made greater by forming the coolant flow passage in two or more stages than when the coolant flow passage has one stage, and the cooling capacity of the stacked type cooler can be improved.

Similarly, when the coolant flow passage is arranged in two or more stages, a corresponding diameter (diameter of a circle having the same area) of the section of each coolant flow passage can be made small. Therefore, the heat transfer ratio between the cooling tube and the coolant can be increased and the cooling capacity of the stacked type cooler can be improved (refer to Embodiment 1).

As described above, the invention can provide a stacked type cooler having an excellent cooling capacity.

In the invention, the electronic component is a semiconductor module having built-in semiconductor chips such as IGBTs and diodes, for example. The semiconductor module can be used for a car inverter, for a motor driving inverter for industrial equipment and for an inverter for an air-conditioner for air-conditioning a building.

Besides the semiconductor module described above, a power transistor, a power FET, an IGBT, and so forth, can be used as the electronic component.

The coolant described above can be water mixed with an ethylene glycol type antifreezing solution, a natural coolant such as water or ammonia, a fluorocarbon type coolant such as fluorinate, a fron type coolant such as HCFC123 or HFC134a, an alcohol type coolant such as methanol or alcohol and a ketone type coolant such as acetone.

The two or more stages of the coolant flow passages disposed in the inside cooling tube are preferably partitioned from one another by an intermediate wall arranged between the first tube wall and the second tube wall.

In this case, the two or more stages of the coolant flow passages can be easily formed.

The inside cooling tube preferably has inner fins for partitioning the coolant flow passage into a plurality of segments in a direction intersecting at right angles the direction of thickness of the inside cooling tube.

In this case, the existence of the inner fins can further improve the contact area between the inside cooling tube and the coolant.

Examples of the cooling tube having such a structure include an extrusion molded tube having a flat shape and a tube having a so-called "drone cup structure" that will be described later.

The inside cooling tube is preferably formed by stacking and bonding a plurality of extrusion molded tubes having a flat shape and integrally having an outer profile portion having a flat shape and including the first and second tube walls and the inner fins partitioning the coolant flow passage into a plurality of segments.

In this case, a large number of extrusion molded tubes having the same shape are formed in advance and, when used as the inside cooling tube, a plurality of extrusion molded tubes can be stacked and bonded. Therefore, the production cost can be reduced.

The inside cooling tube includes a pair of outer shell plates constituting the first and second tube walls, an intermediate plate interposed between the pair of outer shell plates and the inner fins having a corrugation form and interposed between the intermediate plate and the outer shell plates. The first and second coolant flow passages are formed between the intermediate plate and the outer shell plates, respectively.

In this case, the outer shell plate, the intermediate plate and the inner fin are press molded separately and respectively and are then bonded to one another. In consequence, an inside cooling tube having the so-called "drone cup structure" can be easily formed.

The inner fins can be easily formed at desired portions. Therefore, processing of the connection portions becomes easier by not arranging the inner fins at the connection portion with the connecting pipe in the inside cooling tube.

The inner fins are preferably formed at least throughout the entire area in which the electronic component is in contact with the cooling tube.

In this case, the heat transfer area between the cooling tube and the coolant can be secured in the area where the electronic component is in contact with the cooling tube. Consequently, the electronic component can be reliably cooled.

The inner fin is arranged into two or more segments in the flowing direction of the coolant, and a gap of at least 1 mm is preferably secured between the inner fins in the coolant flowing direction.

In this case, a boundary layer of the flow of the coolant, formed in the area in which the inner fins are arranged, does not appear in the gap when the coolant is allowed to flow through the cooling tube. Therefore, the formation of the large boundary layer can be prevented, and the cooling capacity of the stacked cooler can be improved.

When the gap is less than 1 mm, the boundary layer cannot be distinguished sufficiently. Therefore, it is sometimes difficult to sufficiently improve the cooling capacity of the stacked type cooler.

Preferably, the gap does not enter the contact area of the electronic component with the cooling tube. It is thus possible to easily provide a compact stacked type cooler while the heat transfer area is secured.

The outer shell plate preferably has a core material formed of a metal material and on its outer surface a bare surface exposing the metal material constituting the core material.

In this case, the inside cooling tube and the electronic component can be brought into mutual contact with the bare surface. Therefore, the plate surface (surface of cooling tube) does not become coarse due to brazing. The contact thermal resistance between the electronic component and the plate can thus be decreased and cooling efficiency can be improved.

Aluminum (inclusive of aluminum alloys), copper (inclusive of copper alloys), and so forth, can be used as the metal material constituting the core material but aluminum is most preferred from the aspects of performance, corrosion resistance, reduction of weight and other aspects.

The outer shell plate is preferably constituted by a brazing sheet having a sacrificial anode material on the inner surface of the core material.

In this case, it is possible to prevent the formation of holes in the inside cooling tube due to corrosion and the leak of the coolant. In other words, because the sacrificial anode material is disposed on the inner surface of the core material, the sacrificial anode material is selectively corroded and corrosion of the core material of the outer shell pate can be prevented. Consequently, corrosion does not proceed in the direction of thickness of the outer shell plate and the formation of the holes in the inside cooling tube can be prevented.

Metal materials having a lower melting point than that of the core material can be used for the brazing material. Particularly when the core material is formed of aluminum, aluminum having a lower melting point than that of the core material is preferably used.

The outer shell plate preferably has a three-layered structure including a brazing material deposited onto the sacrifice anode material disposed on the inner surface of the core material. In this case, the brazing material facilitates bonding with the inner fins having the corrugation shape and because the sacrificial anode material exists on the inner surface of the core material after brazing, the formation of the holes in the outer shell plate can be suppressed.

The outer shell plate is preferably formed of a brazing sheet having a brazing material on the inner surface of the core material described above. When sufficient measures against corrosion of the core material are taken, an outer shell plate including a brazing material not having a sacrificial anode material can be employed and the cost of the outer shell plate can be reduced.

The inner fin is preferably formed of a material that is potentially baser than the core material of the outer shell plate. In this case, the inner fin can be brought into the state where it is more easily corroded than the outer shell plate and the progress of corrosion of the outer shell pate can be suppressed.

Incidentally, the term "metal baser than the core material" represents those metals the corrosion potential of which is lower than that of the metal forming the core material. When aluminum (Al) is used for the core material and the brazing material, for example, a metal material to which zinc (Zn) is added can be used for the core material used for the inner fin.

The inner fin is preferably formed of a brazing sheet having a brazing material deposited to both surfaces of the core material. In this case, the outer shell plate and the inner fin or the intermediate plate and the inner fin can be easily bonded by using the brazing material disposed on the inner fin.

The intermediate plate preferably includes a core material and a brazing sheet having a brazing material deposited to both surfaces of the core material, and the inner surfaces at the end portions of the pair of outer shell plates are preferably bonded to two surfaces at the end portions of the intermediate plate.

In this case, the intermediate plate and the pair of outer shell plates can be easily bonded by brazing.

The intermediate plate is formed of a material that is potentially baser than the core material of the outer shell plate and the pair of outer shell plates can be mutually bonded on their inner surfaces at the end portions. In this case, the intermediate plate and the inner fin can be bonded by brazing by using the brazing material disposed on the inner fin, for example. Corrosion of the outer shell plate can be prevented by allowing the intermediate plate to be preferentially corroded with respect to the outer shell plate. Consequently, a leak of the coolant from the cooling tube can be prevented. Because the brazing material is disposed on the joint surfaces of the pair of outer shell plates, these outer shell plates can be easily brazed and the production of the cooling tube can be carried out easily.

The inner fins are divided into a plurality of fins in the longitudinal direction and are preferably constituted by offset fins formed by arranging a large number of segments having a corrugation form with their crests being deviated in a zigzag shape.

In this case, the heat exchange efficiency in the inner fin becomes higher and a stacked type cooler having higher cooling performance can be acquired.

The flow passage width wf of the adjacent inner fins is preferably smaller than the height hf of the inner fin (wf<hf). When the width of the cooling tube is constant, the heat transfer area with the coolant becomes greater when the height hf of the inner fin is greater than the flow passage width wf and heat exchange efficiency can be increased.

The flow passage width wf of the inner fin is preferably 1.5 mm or below. When the flow passage width wf of the inner fin is smaller, the number of the coolant flow passages can be increased and the heat transfer area with the coolant can be increased. When the flow passage width wf of the inner fin is 1.5 mm or below, the effect of improving the heat transfer area with the coolant can be sufficiently exhibited and a superior cooling effect can be obtained. Incidentally, when the flow passage width wf of the inner fin is too small and when foreign matter enters the coolant, the foreign matter is likely to clog the flow passages and impede fluidity. Therefore, the flow passage width wf of the inner fin is preferably about 0.9 mm.

The height hf of the inner fin is preferably within the range of 1 to 5 mm. The greater the height hf of the inner fin, the greater becomes the improvement of the transfer area with the coolant. When the height hf exceeds 5 mm, however, the overall size becomes large. When the height hf is less than 1 mm, on the other hand, the flow resistance of the coolant becomes high.

The thickness tf of the inner fin is preferably smaller than the thickness tp of the first and second tube walls. When this relation is kept, the drop of adhesion among the first and second tube walls and the electronic component can be prevented when the electronic component is brought into pressure contact with the outer shell plate. Because the inner fin is thinner than the first and second tube walls, the inner fin is more likely to undergo deformation. Therefore, the surfaces of the first and second tube walls become more compatible with the surface of the electronic component, the contact heat resistance can be reduced and cooling efficiency can be improved.

The thickness tf of the inner fin is preferably within the range of 0.03 to 1.0 mm. When the thickness tf of the inner fin is 1.0 mm or below, a cooling capacity for sufficiently cooling the electronic component can be easily obtained. When the thickness tf is less than 0.03 mm, rigidity becomes too low structurally and production becomes difficult.

The thickness tp of the first and second tube walls is preferably within the range of 0.1 to 5.0 mm. The smaller the thickness tp of the first and second tube walls, the higher becomes the heat transfer property and the higher becomes the cooling effect, too. When the thickness tp of the first and second tube walls is smaller than 5.0 mm, the cooling capacity for sufficiently cooling the electronic component can be more easily acquired. When the thickness tp is less than 0.1 mm, on the other hand, the rigidity becomes too low structurally and adhesion with the electronic component drops.

Preferably, the connecting pipe is a bellows tube capable of extension and contraction in the communication direction and is so constituted as to be capable of changing the gaps between the adjacent cooling tubes.

In this case, the electronic component can be interposed easily and reliably between the cooling tubes.

The outside cooling tube has one stage of the coolant flow passage in the direction of thickness of the cooling tube, and the coolant flow passage formed in the outside cooling tube and the coolant flow passage formed in the inside cooling tube preferably have mutually the same sectional area.

In this case, the flow passage resistance of the coolant flow passage of the outside cooling tube and the flow passage resistance of the inside cooling tube can be made substantially equal to each other. Therefore, a plurality of electronic components can be efficiently cooled.

The thickness of the outer tube wall of the outside cooling tube on the side where the electronic component is not disposed in contact is preferably greater than the thickness of other tube walls.

In this case, the strength of the outer tube wall of the outside cooling tube can be secured and the formation of holes due to corrosion can be prevented more reliably.

In other words, from the construction of the stacked type cooler, the pressure of the coolant introduced greatly acts on the outer tube wall of the outside cooling tube. Therefore, when the strength is improved by increasing the thickness of the outer tube wall, deformation resulting from the pressure of the coolant can be prevented. When the brazing material is disposed on the inner surface of the outer tube wall, the sacrificial anode material cannot be disposed easily. Therefore, the formation of holes (due to corrosion) is prevented by increasing the thickness of the outer tube wall without disposing the sacrifice anode material.

The outer tube wall preferably has a thickness of 1 mm or more.

In this case, it becomes possible to secure sufficient strength of the outer tube wall, to more reliably prevent the formation of holes and to obtain a stacked type cooler that is light in weight.

When the thickness of the outer tube wall is less than 1 mm, it may be difficult to secure the strength and the corrosion resistance of the outer tube wall. When the thickness exceeds 2 mm, on the other hand, a stacked type cooler that is light in weight cannot be obtained easily. Therefore, the thickness of the outer tube wall is preferably 2 mm or less.

According to another aspect of the invention, the coolant flow passage is divided into a first coolant flow passage and a second coolant flow passage aligned in the stacking direction by an intermediate wall arranged in the coolant flow passage, and a cooling capacity on the side of the first coolant flow passage and a cooling capacity on the side of the second coolant flow passage are different.

According to this cooler, the electronic component can be efficiently cooled by bringing the surface having a greater calorific amount (heat radiation amount) in the electronic component into conformity with the coolant flow passage having a higher cooling capacity and the surface having a smaller calorific amount (heat radiation amount) in the electronic component into conformity with the coolant flow passage having a lower cooling capacity.

Because the temperature rises of the coolants flowing through the first and second coolant flow passages become substantially equal, the transfer of heat decreases and the occurrence of distortion of the cooling tube due to the temperature difference can be prevented, thereby improving reliability (life) of the cooling tube. Because the surface temperature on both surfaces of the electronic component becomes substantially uniform, the occurrence of distortion of the electronic component resulting from the temperature difference can be prevented and the reliability (the life) of the electronic component can be improved.

In the invention, the cooling capacity on the side of the first coolant flow passage and the cooing capacity on the side of the second coolant flow passage may be made different by making the flow rate of the coolant of the first coolant flow passage different from the flow rate of the coolant of the second coolant flow passage.

According to still another aspect of the invention, there is provided a stacked type cooler which further includes a cylindrical connecting pipe for connecting the inlet side of the coolant of the cooling tubes adjacent to each other, and wherein an insertion hole into which the cylinder portion of the connecting pipe is inserted is formed in the cooling tube, an intermediate wall arranged in the coolant flow passage divides the coolant flow passage into a first coolant flow passage and a second coolant flow passage aligned with each other in the stacking direction of the cooling tubes, an intermediate wall hole for connecting the first coolant flow passage with the second coolant flow passage is formed in the intermediate wall at a position facing the insertion hole and an inner diameter (D1) of the cylinder portion and an inner diameter (D2) of the intermediate wall hole are different.

According to this construction, because the inner diameter of the cylinder portion and the inner diameter of the intermediate wall hole are different, the expanded flow that occurs when the coolant flows from the cylinder portion into the cooling tube as shown in FIG. 25 makes the flow rate of the coolant flowing into the first coolant flow passage different from the flow rate flowing into the second coolant flow passage, and the cooling capacity on the side of the first coolant flow passage can be made different from the cooling capacity on the side of the second coolant flow passage. Therefore, the same effect as that of the invention described above can be acquired.

In the invention, the inner diameter (D2) of the intermediate wall hole is greater than the inner diameter (D1) of the cylinder portion.

According to this construction, the pressure loss at the intermediate wall hole portion can be made smaller than the case where the inner diameter of the intermediate wall hole is smaller than the inner diameter of the cylinder portion.

According to still another aspect of the invention, there is provided a stacked type cooler which further includes a cylindrical connecting pipe for connecting the inlet side of the coolant in the cooling tubes adjacent to each other, and wherein an insertion hole into which the cylinder portion of the connecting pipe is inserted is formed in the cooling tube, an intermediate wall arranged in the coolant flow passage divides the coolant flow passage into a first coolant flow passage and a second coolant flow passage aligned with each other in the stacking direction of the cooling tubes, an intermediate wall hole for connecting the first coolant flow passage with the second coolant flow passage is formed in the intermediate wall at a position facing the insertion hole, the cylinder portion protrudes from the insertion hole into the coolant flow passage, and a projection length (L1) of the cylinder portion on the side of the first coolant flow passage is different from a projection length (L2) of the cylinder portion on the side of the second coolant flow passage.

Because the projection length of the cylinder portion on the side of the first coolant flow passage is different from the projection length of the cylinder portion on the side of the second coolant flow passage, the flow rate of the coolant flowing into the first coolant flow passage is different from the flow rate of the coolant flowing into the second coolant flow passage and the cooling capacity on the side of the first coolant flow passage is different from the cooling capacity on the side of the second coolant flow passage. Accordingly, the same effect as that of the invention described above can be obtained.

According to still another aspect of the invention, there is provided a stacked type cooler wherein an intermediate wall arranged in the coolant flow passage divides the coolant flow passage into a first coolant flow passage and a second coolant flow passage aligned with each other in the stacking direction of the cooling tubes, fins for promoting heat exchange are arranged in the first coolant flow passage and the second coolant flow passage, and heat exchange performance of the fin inside the first coolant flow passage is different from heat exchange performance of the fin inside the second coolant flow passage.

Because the heat exchange performance of the fin inside the first coolant flow passage is different from that of the fin inside the second coolant flow passage in this construction, the cooling capacity on the side of the first coolant flow passage is different from the cooling capacity on the side of the second coolant flow passage. Consequently, the same effect as that of the invention described above can be obtained.

According to still another aspect of the invention, there is provided a stacked type cooler wherein an intermediate wall arranged in the coolant flow passage divides the coolant flow passage into a first coolant flow passage and a second coolant flow passage aligned with each other in the stacking direction of the cooling tubes, and fins for promoting heat exchange are arranged in only one of the first coolant flow passage and the second coolant flow passage.

According to this construction, because the fins are arranged in only one of the first and second coolant flow passages, the cooling capacity on the side of the first coolant flow passage is made different from the cooling capacity on the side of the second coolant flow passage and the same effect as that of the invention described above can be acquired.

The present invention may be more fully understood from the description of preferred embodiments of the invention, as set forth below, together with the accompanying drawings.

DESCRIPTION OF THE PREFERRED EMBODIMENTS

Embodiment 1

A stacked type cooler according to Embodiment 1 of the invention will be explained with reference to FIGS. 1 to 3.

Figure 1:
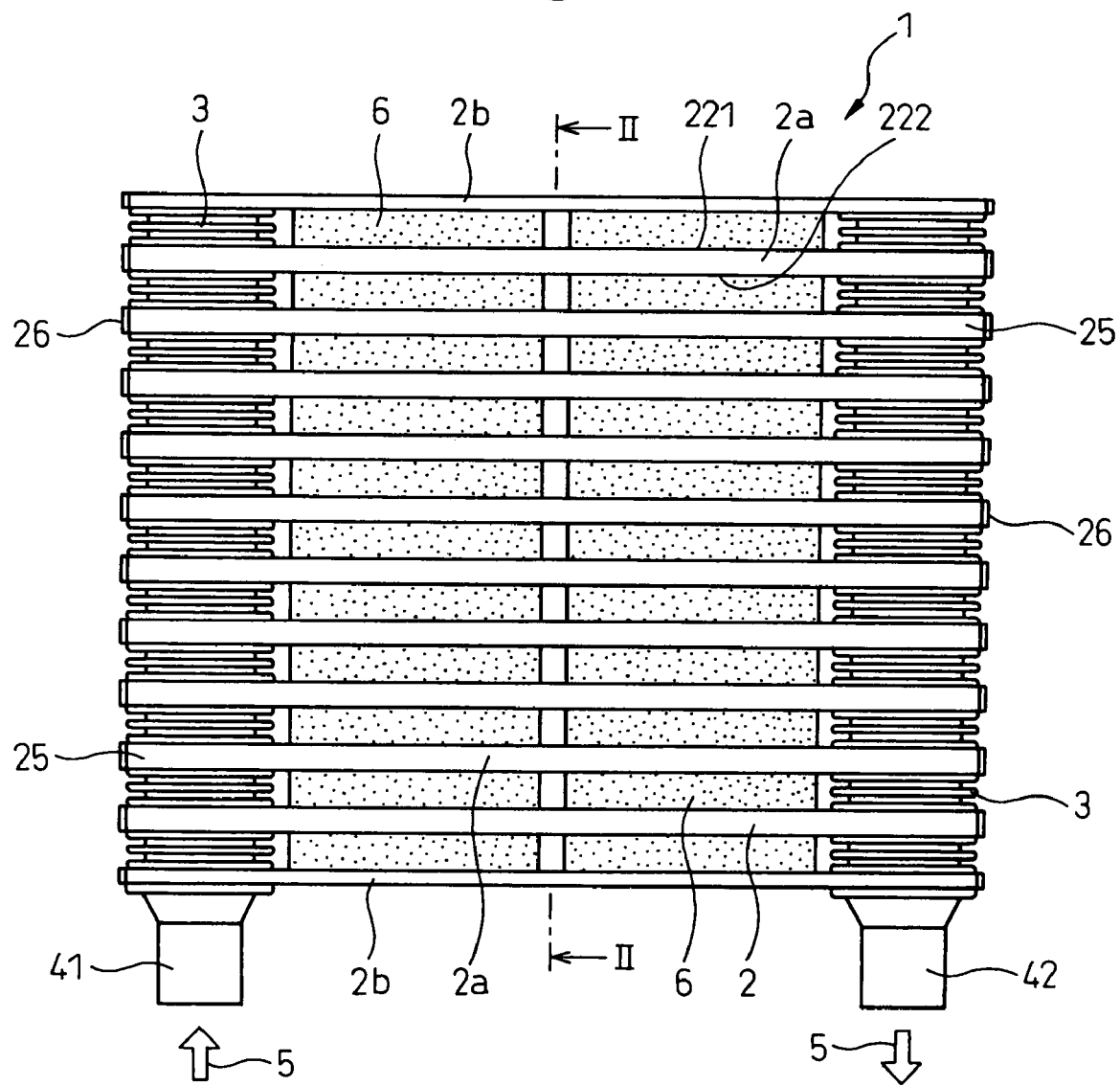
FIG. 1 is a plan view of a stacked type cooler according to Embodiment 1.
Figure 2:
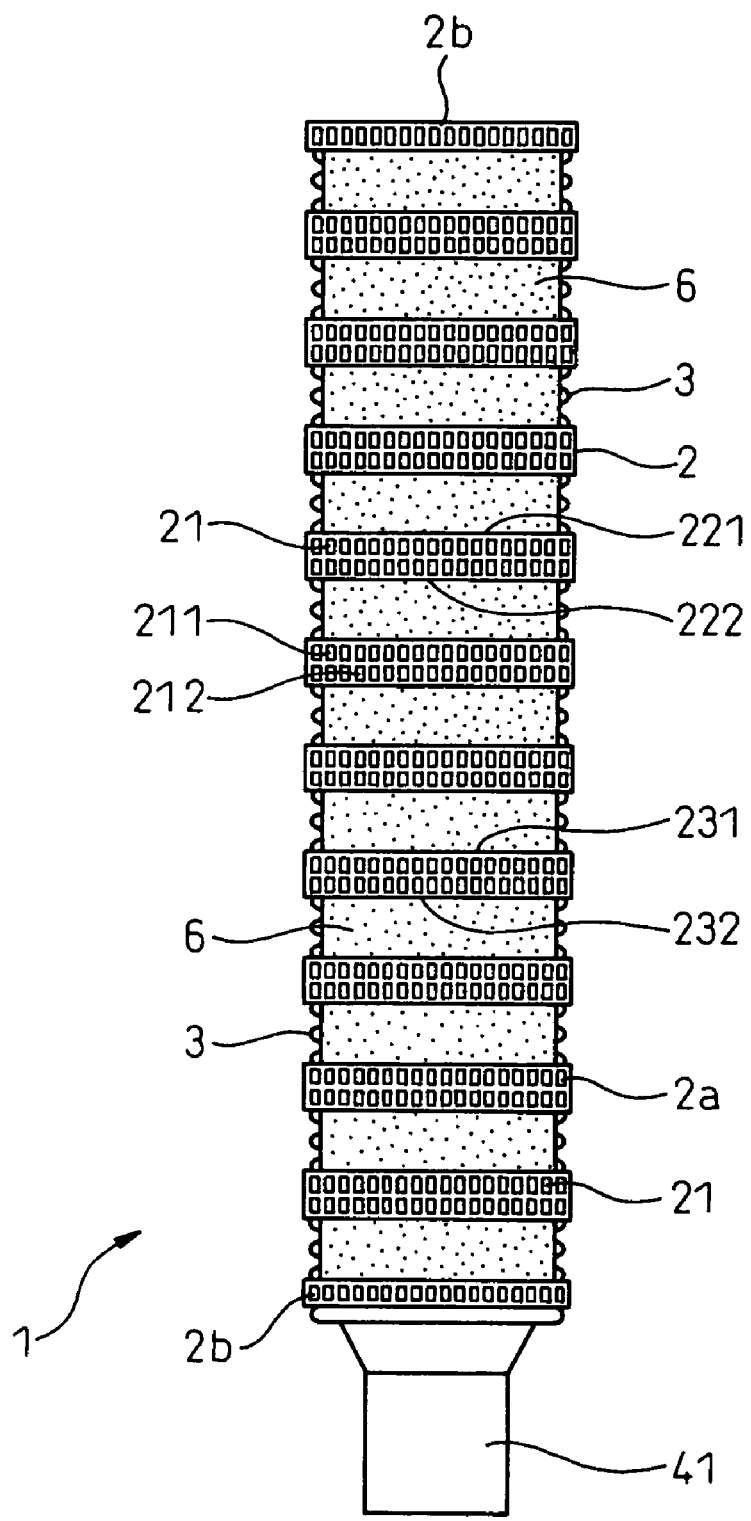
FIG. 2 is a sectional view taken along a line of arrow II-II in FIG. 1.

The stacked type cooler 1 cools a plurality of electronic components 6 each being cooled from two of their surfaces as shown in FIGS. 1 and 2.

The stacked type cooler 1 includes a plurality of cooling tubes 2 having a flat shape and a coolant flow passage 21 for a coolant 5 to flow, and connecting pipe 3 for connecting these cooling tubes 2. The cooling tubes 2 are arranged and stacked in a plurality of layers so that the two cooling tubes 2 can sandwich the electronic component 5 at two surfaces.

The cooling tubes 2 include two outside cooling tubes 2b arranged at both ends in the stacking direction and a plurality of inside cooling tubes 2a interposed between the outside cooling tubes 2b.

Figure 3:
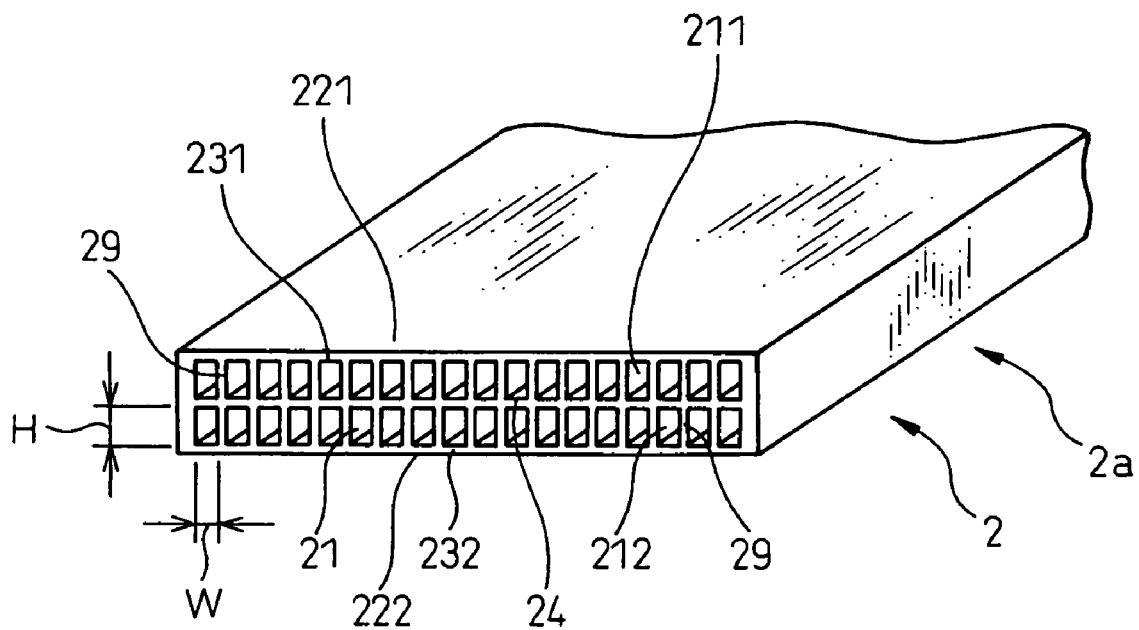
FIG. 3 is a sectional perspective view of an inside cooling tube in Embodiment 1.

The coolant flow passage 21 is formed in two stages inside cooling tube 2a in the direction of the thickness of the inside cooling tube 2a as shown in FIG. 3.

In other words, the inside cooling tube 2a includes a first coolant flow passage 211 facing a first tube wall 231 constituting a first main surface 221 of the inside cooling tube 2a and a second cooling flow passage 212 facing a second tube wall 232 constituting a second main surface 222 on the opposite side to the first main surface 221.

The two-stage coolant flow passages 21, that is, the first coolant flow passage 211 and the second coolant flow passage 212, are divided from each other by an intermediate wall 24.

A plurality of first coolant flow passages 211 and a plurality of second coolant flow passages 212 are formed and aligned in the transverse direction of the cooling tube 2. More concretely, a large number of inner fins 29 are arranged in such a fashion as to divide the coolant flow passages 211 and 212 in a direction orthogonally intersecting the direction of thickness of the cooling tube 2.

The outside cooling tube 2b is arranged by forming in one stage the coolant flow passage 21 in the direction of thickness of the cooling tube 2 as shown in FIG. 2. The coolant flow passage 21 of one stage formed in the outside cooling tube 2b and the coolant flow passage 21 of one stage formed in the inside cooling tube 2a have a mutually equal sectional area as shown in FIG. 2.

The connecting pipe 3 is a bellows tube capable of extension and contraction in the communication direction and is so constituted as to be capable of changing the gap of each cooling tube 2.

The connecting pipe 3 is connected to two end portions 25 of the cooling tube 2 in the longitudinal direction to connect a plurality of cooling tubes 2 as shown in FIG. 1. In other words, the cooling tube 2 forms opening portions in the first and second main surfaces 221 and 222 at each end portion 25 to connect the connecting pipe 3 to the opening portion. A coolant inlet pipe 41 for introducing the coolant 5 into the stacked type cooler 1 and a coolant outlet pipe 42 for discharging the coolant 5 from the stacked type cooler 1 are connected to the two end potions of the outside cooling tube 2b, respectively.

The cooling tube 2 and the connecting pipe 3 are connected by brazing.

The cooling tube 2 is an extrusion molding of aluminum and both of its end faces in the longitudinal direction are closed by side surface seal members 26. The side surface seal member 26, the coolant inlet pipe 41 and the coolant outlet pipe 42 are connected to the cooling tube 2 by brazing, too.

The side surface seal member 26, the coolant inlet pipe 41, the coolant outlet pipe 42 and the connecting pipe 3 are formed of aluminum.

The coolant 5 introduced from the coolant inlet pipe 41 flows into each cooling tube 2 from one of the end portions 25 through the connecting pipe 3 and flows towards the other end 25 inside the respective coolant flow passage 21. The coolant 5 passes through the connecting pipe 3 connected to the end portion 25 and is discharged from the coolant outlet pipe 42.

While flowing through the coolant flow passage 21, the coolant 5 conducts heat exchange with the electronic component 6 and cools the electronic component 6.

The electronic component 6 is a semiconductor module having a semiconductor chip such as an IGBT and a diode that are built therein. The semiconductor module constitutes a part of an inverter for an automobile.

Water mixed with an ethylene glycol type antifreezing solution is used as the coolant 5.

The electronic component 6 can be arranged while it keeps direct contact with the cooling tube 2. Depending on the case, however, an insulating plate such as a ceramic plate or heat conductive grease may be interposed between the electronic component 6 and the cooling tube 2.

Next, the function and effect of the invention will be explained.

The coolant flow passage 21 is formed in two stages in the inside cooling tube 2a in the direction of thickness of the inside cooling tube 2a and the inside cooling tube 2a has the first coolant flow passage 211 and the second coolant flow passage 212. Therefore, the coolant 5 flowing through the first coolant flow passage 211 cools the electronic component 6 so arranged as to keep contact with the first main surface 221 of the inside cooling tube 2a and the coolant 5 flowing through the second coolant flow passage 212 cools the electronic component 6 so arranged as to keep contact with the second main surface 222.

Therefore, even when exothermy of the electronic component 6 so arranged as to keep contact with the first main surface 221 (second main surface 222) is great, the coolant 5 receiving this heat does not flow towards the second main surface 222 (first main surface 221). In other words, it is thus possible to prevent the heat from reaching the second main surface 222 (first main surface 221) and the temperature of the electronic component 6 so arranged as to keep contact with the second main surface 222 (first main surface 221) from elevating.

When the sectional area of the coolant flow passage 21 is constant, the heat transfer area between the cooling tube 2 and the coolant 5 can be increased by forming the coolant flow passage 21 in two stages in comparison with the case of one stage. Consequently, the cooling capacity of the stacked type cooler 1 can be improved.

Similarly, when the coolant flow passage 21 is formed in two or more stages, the corresponding diameter (diameter of circle having same area) of the section of each coolant flow passage 21 can be reduced. Consequently, the heat transfer ratio between the cooling tube 2 and the coolant 5 becomes higher and the cooling capacity of the stacked type cooler 1 can be improved.

The heat transfer ratio ($\alpha$) described above can be expressed by the following formula (1) by using the corresponding diameter (d) described above, the Nusselt number (Nu) and the thermal conductivity ($\lambda$):

$$\lambda = Nu \cdot \lambda / d \quad (1)$$

Therefore, the heat transfer ratio $\alpha$ can be improved by reducing the corresponding diameter d.

In this embodiment, the corresponding diameter d is calculated in the following way. In other words, when the coolant flow passage 21 has a rectangular section, the length of its major side is H and the length of its minor side is W, the corresponding diameter d is calculated by the following formula (2):

$$D = 4W \cdot H / (2H + 2W) \quad (2)$$

The coolant flow passages 21 disposed in the inside cooling tube 2a are divided from one another by the intermediate wall 24. In this way, the coolant flow passages 21 of the two stages can be easily formed.

The connecting pipe 3 is a bellows tube and is so constituted as to be capable of changing the gap between each cooling tube 2. Therefore, the electronic component 6 can be interposed easily and reliably between the cooling tubes 2.

As shown in FIG. 2, the outside cooling tube 2b is arranged by forming in one stage the coolant flow passage 21 in the direction of thickness of the cooling tube 2 and the coolant flow passage 21 of one stage formed in the outside cooling tube 2b and the coolant flow passage 21 of one stage formed in the inside cooling tube 2a have a mutually equal sectional area. Therefore, the flow passage resistance of the coolant flow passage 21 of the outside cooling tube 2b can be made substantially equal to the flow passage resistance of the cooling flow passage 21 of the inside cooling tube 2a and a plurality of electronic components 6 can be cooled efficiently.

As described above, this embodiment can provide a stacked type cooler having an excellent cooling capacity.

Embodiment 2

Figure 4:
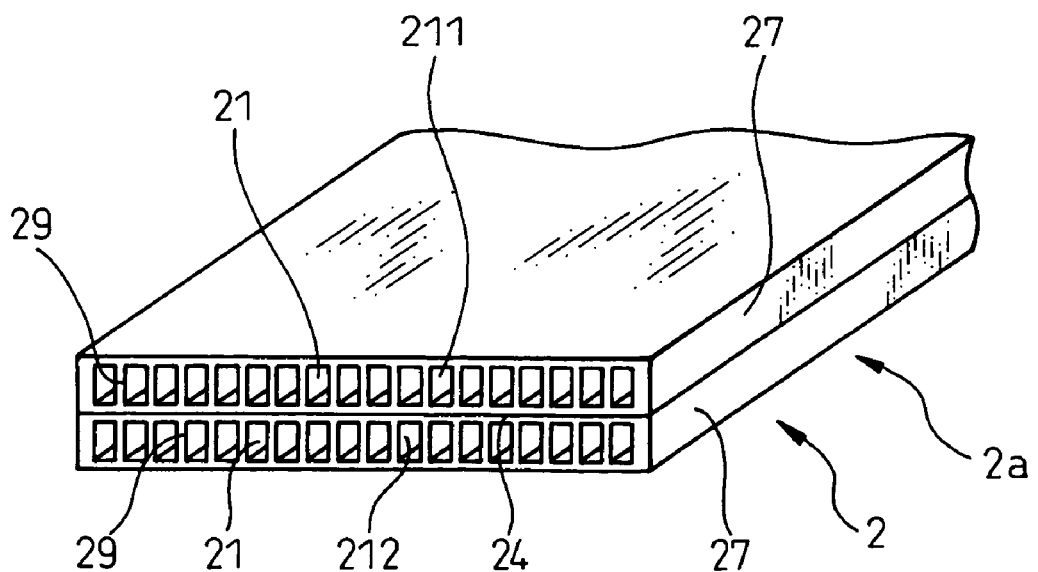
FIG. 4 is a sectional perspective view of an inside cooling tube in Embodiment 2.

This embodiment represents an example of a stacked type cooler 1 having a construction in which a plurality of flat extrusion molding tubes 27 having a coolant flow passage 21 is stacked and bonded to one another as shown in FIG. 4 to constitute an inside cooling tube 2a.

In the extrusion molding tube 27 of this embodiment, the coolant flow passage 21 is formed in one stage in the direction of thickness. Tube walls stacked with one another constitute intermediate walls 24. The rest of the constructions are the same as those of Embodiment 1.

To use as the inside cooling tube 2a in this case, a plurality of extrusion molding tubes 27 can be stacked and bonded by forming in advance a large number of extrusion molding tubes 27 having the same shape.

The outside cooling tube 2b, too, can be constituted by use of the extrusion molding tube 27. In this case, the extrusion molding tube 27 is used alone without stacking.

Both of the inside and outside cooling tubes 2a and 2b can be constituted in this way by using one kind of extrusion molding tubes 27. Therefore, the production cost of the stacked type cooler 1 can be reduced.

This embodiment provides the same function and effect as that of Embodiment 1.

Embodiment 3

This embodiment represents an example where the inside cooling tube 2a has a so-called "drone cup" structure as shown in FIGS. 5 to 8.

In other words, the inside cooling tube 2a includes a pair of outer shell plates 201 constituting first and second tube walls 231 and 232, respectively, an intermediate plate 202 interposed between the pair of outer shell plates 201 and constituting the intermediate wall 24 and corrugated inner fins 203 interposed between the intermediate plate 202 and the outer shells 201.

First and second coolant flow passages 211 and 212 are formed between the intermediate plate 202 and the outer shell plates 201.

Figure 5:
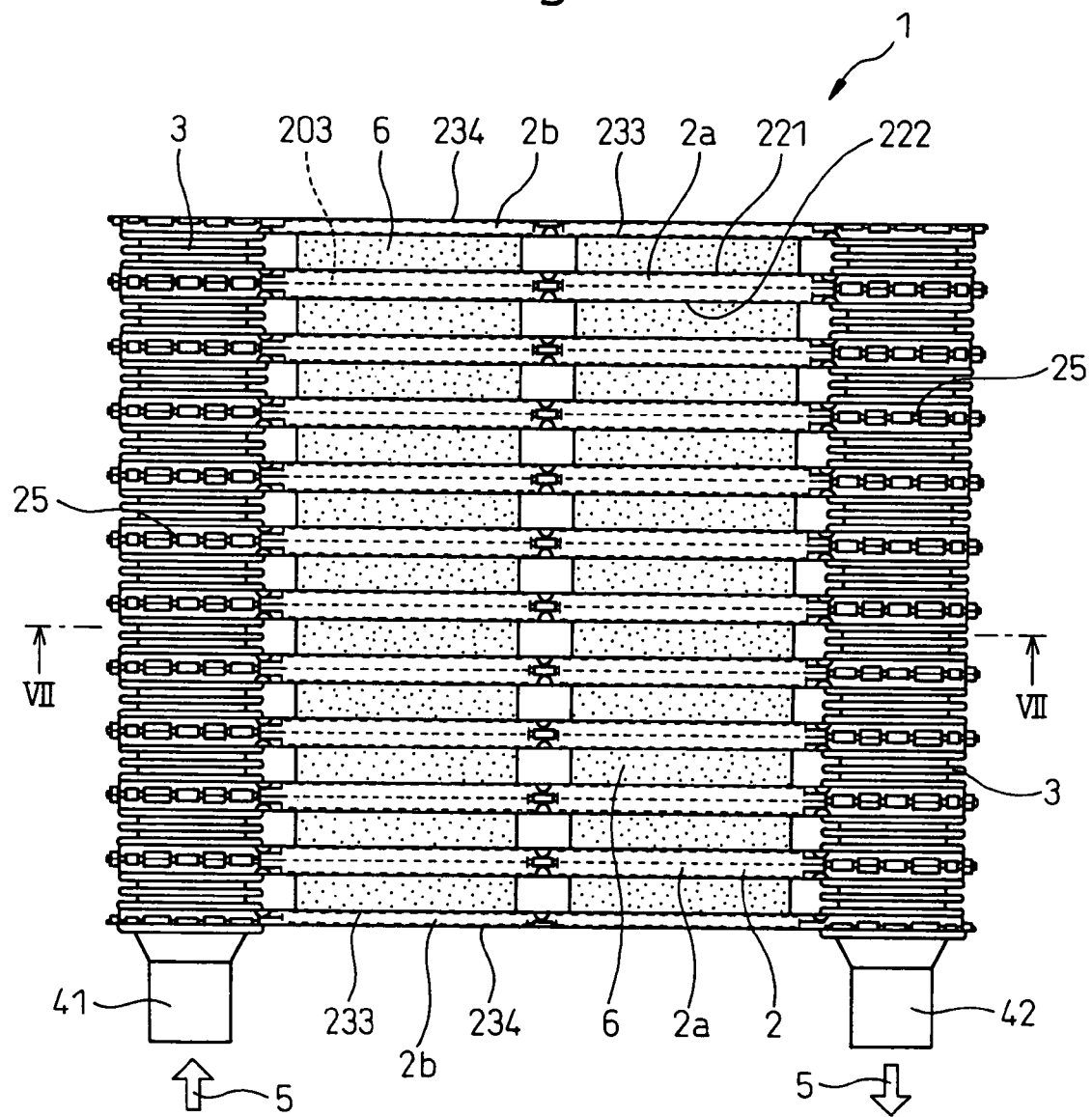
FIG. 5 is a plan view of stacked type cooler in Embodiment 3.
Figure 6:
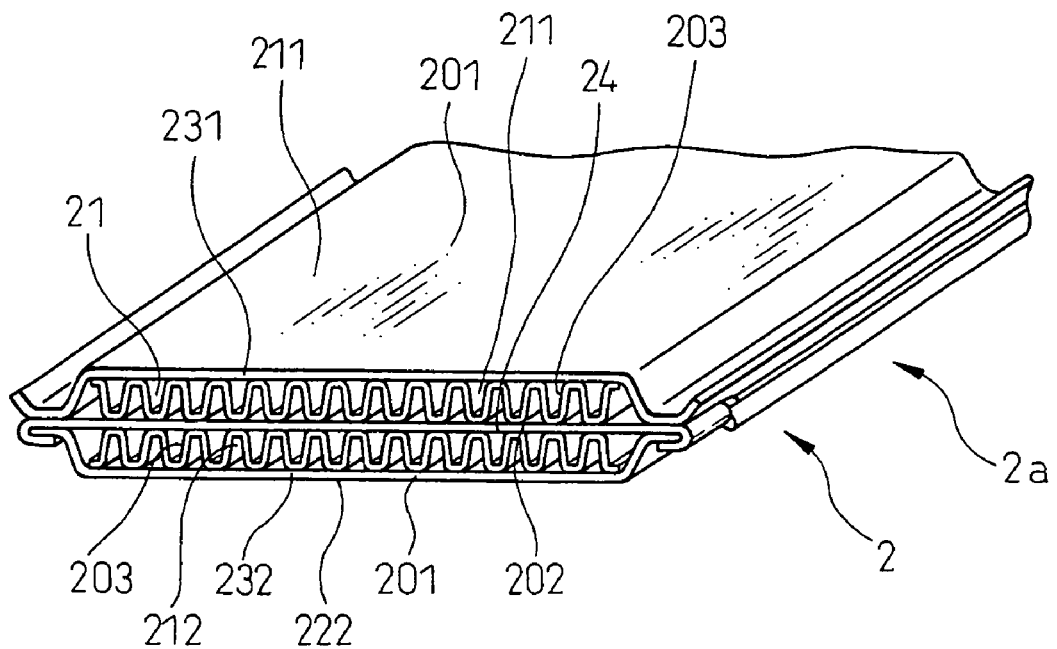
FIG. 6 is a sectional perspective view of an inside cooling tube in Embodiment 3.
Figure 7:
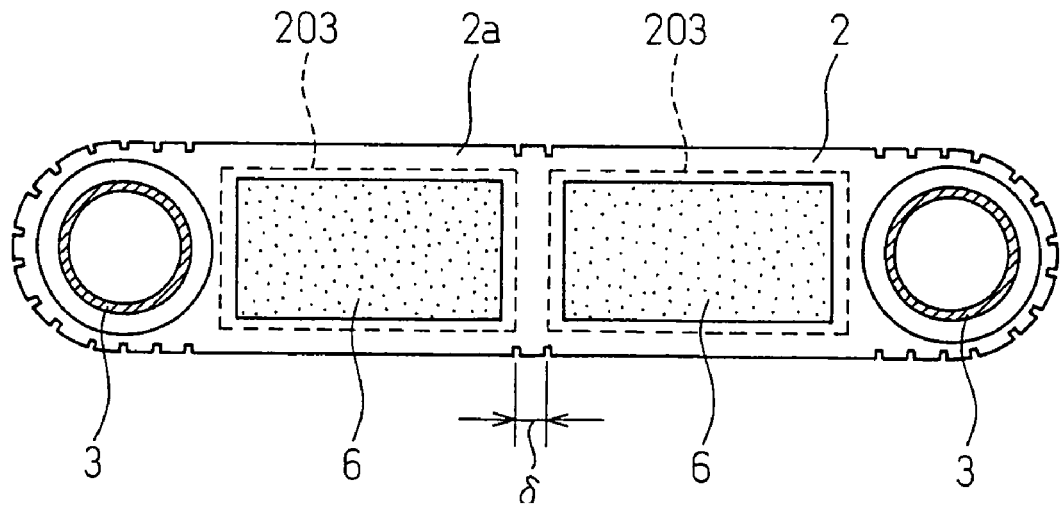
FIG. 7 is a sectional view taken along a line of arrow VII-VII in FIG. 5.

The inner fin 203 is formed in a greater area than an area where the electronic component 6 keeps contact with the cooling tube 2 as shown in FIGS. 5 and 7.

Two inner fins 203 are disposed in the flowing direction of the coolant 5 and a gap $\delta$ of at least 1 mm is formed between the adjacent inner fins 203.

Figure 8:
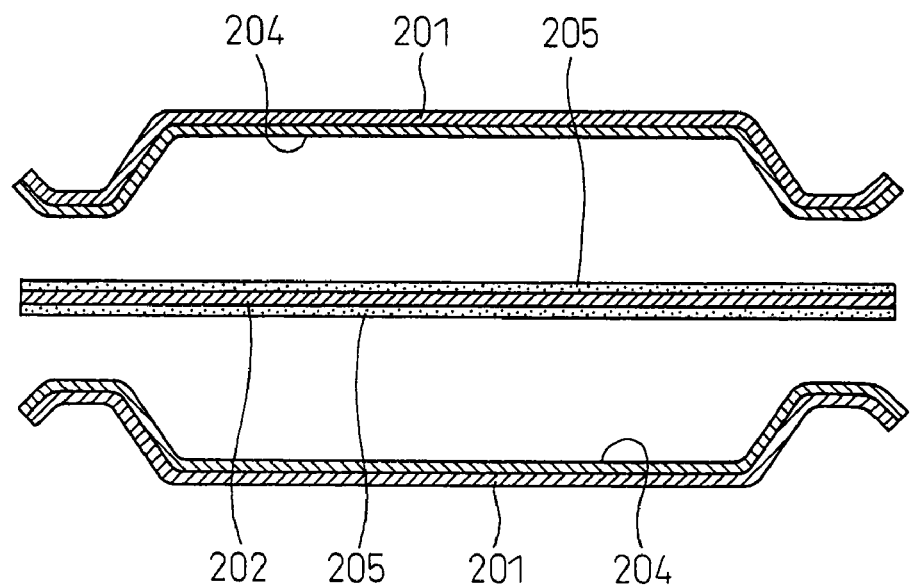
FIG. 8 is a sectional explanatory view of an outer shell plate in Embodiment 3.

As shown in FIG. 8, the outer shell plate 201 is a brazing sheet having a sacrificial anode material 204 formed on its inner surface and the intermediate plate 202 is a brazing sheet having a brazing material 205 on both of its surfaces.

As shown in FIG. 5, the outside cooling tube 2b includes an inside tube wall 233 on the side of the contact arrangement of the electrode component 6, an outside tube wall 234 on the opposite side to the inside tube wall 233 and an inner fins 203 disposed in a corrugation form between both tube walls. The inside tube wall 233 is a brazing sheet having a sacrificial anode material 204 on its inner surface and the outside tube wall 234 is a brazing sheet having a brazing material 205 on its inner surface.

The thickness of the outside tube wall 234 of the outside cooling tube 2b is greater than the thickness of other tube walls and is 1 mm. The other tube walls, that is, the inside tube wall 233, the first tube wall 231, the second tube wall 232 and the intermediate wall 24, have a thickness of 0.4 mm.

The thickness of the inner fin 203 is 0.2 mm.

The pipe wall thickness of the connecting pipe 3 is 0.3 mm. The sacrificial anode material is disposed on the inner surface and the brazing material is disposed on the outer surface. The thickness of the pipe wall of the coolant inlet pipe 41 and the coolant outlet pipe 42 is 1 mm and the sacrifice anode material is disposed on the inner surface.

The rest of the constructions are the same as those of Embodiment 1.

In this embodiment, the outer shell plate 201, the intermediate plate 202 and the inner fin 203 are separately formed by press molding and are then bonded to one another to acquire the inside cooling tube 2a having the so-called "drone cup" structure. Therefore, the inside cooling tube 2a can be easily produced.

The inner fins 203 can be easily formed at desired positions. Consequently, when the inner fins 203 are not arranged at the connection portion with the connecting pipe 3 in the inside cooling tube 2a, processing of the opening portion as the connection portion can be easily made.

The inner fins 203 are formed in the area that is greater than the area where the electronic component 6 is in contact with the cooling tube 2, and includes this contact area. Therefore, the heat transfer area between the cooling tube 2 and the coolant 5 can be secured in the area where the electronic component 6 is in contact with the cooling tube 2 with the result that the electronic component 6 can be reliably cooled.

The gap δ of at least 1 mm is formed between the two inner fins 203 arranged in the flowing direction of the coolant 5 as shown in FIG. 7. Therefore, when the coolant 5 is caused to flow through the cooling tube 2, the boundary layer of the flow of the coolant 5 formed in the area, in which the inner fins 203 are disposed, disappears at the gap δ. It is thus possible to largely prevent the boundary layer from greatly formed and to improve the cooling capacity of the stacked type cooler 1.

The outer shell plate 201 is the brazing sheet having the sacrifice anode material 204 on its inner surface and the intermediate plate 202 is the brazing sheet having the brazing material 205 on both of its surfaces.

Therefore, it is possible to prevent the formation of holes in the inside cooling tube 2a due to corrosion and a leak of the coolant 5. In other words, because the sacrificial anode material 204 is arranged on the inner surface of the outer shell plate 201, the sacrificial anode material 204 is selectively corroded and corrosion of the core material of the outer shell plate 201 can be prevented. Consequently, corrosion of the outer shell plate 201 does not proceed in the direction of thickness and the formation of holes in the inside cooling tube 2a can be prevented.

Because the intermediate plate 202 is formed of the brazing sheet having the brazing material 205 on both of its surfaces, the intermediate plate 202 can be easily brazed to the pair of outer shell plates 201.

The one stage of the coolant flow passage 21 formed in the outside cooling tube 2b and the one stage of the coolant flow passage 21 formed in the inside cooling tube 2a have a mutually equal sectional area. Therefore, the flow passage resistance can be made substantially equal between the coolant flow passage 21 of the outside cooling tube 2b and the coolant flow passage 21 of the inside cooling tube 2a and a plurality of electronic components 5 can be efficiently cooled.

The thickness of the outside tube wall 234 of the outside cooling tube 2b is greater than the thickness of other pipe walls. It is therefore possible to secure the strength of the outside tube wall 234 and to more reliably prevent the forma-tion of the hole due to corrosion. In other words, a great pressure of the coolant 5 acts on the outside tube wall 234 of the outside cooling tube 2b due to the construction of the stacked type cooler 1. Therefore, deformation resulting from the pressure of the coolant 5 can be prevented by increasing the thickness of the outside tube wall 234 and improving the strength. The sacrificial anode material 204 is not arranged on the outside tube wall 234 as described above. Therefore, the formation of holes due to corrosion is prevented by increasing the thickness of the outside tube wall 234.

Because the thickness of the outside tube wall 234 is 1 mm, it is possible to sufficiently secure the strength of the outside tube wall 234, to more reliably prevent the formation of holes due to corrosion and to acquire a light-weight stacked type cooler 1.

This embodiment exhibits the same function and effect as that of Embodiment 1.

Embodiment 4

This embodiment represents the case where the inner fins 203 of the cooling tube 2 are constituted by arranging zigzag the positions of crests 209 of a large number of segments 208 having a corrugation form to provide offset fins.

Figure 9:
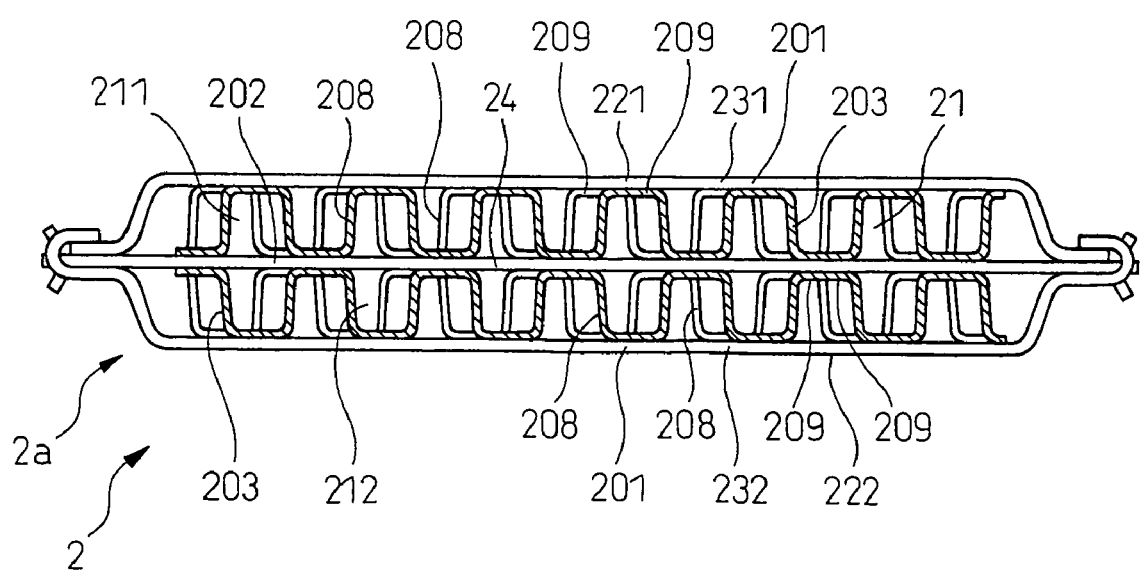
FIG. 9 is a sectional view of an inside cooling tube in Embodiment 4.

In other words, the inner fins 203 are constituted as a large number of segments 208 having substantially the same corrugation shape are alternately arranged in the longitudinal direction of the cooling tube 2 while the corrugation shapes are deviated by ¼ wavelength as shown in FIG. 9.

The rest of the constructions are the same as those of Embodiment 3.

In this case, heat exchange efficiency by the inner fins 203 becomes higher and a stacked type cooler 1 having a higher cooling performance can be acquired.

This embodiment can acquire the same function and effect as that of Embodiment 3.

In the embodiment described above, the coolant flow passage 21 in the inside cooling tube 2a is formed in two stages in the direction of the thickness of the cooling tube 2 but the coolant flow passage may be disposed in three or more stages.

Embodiment 5

Figure 10:
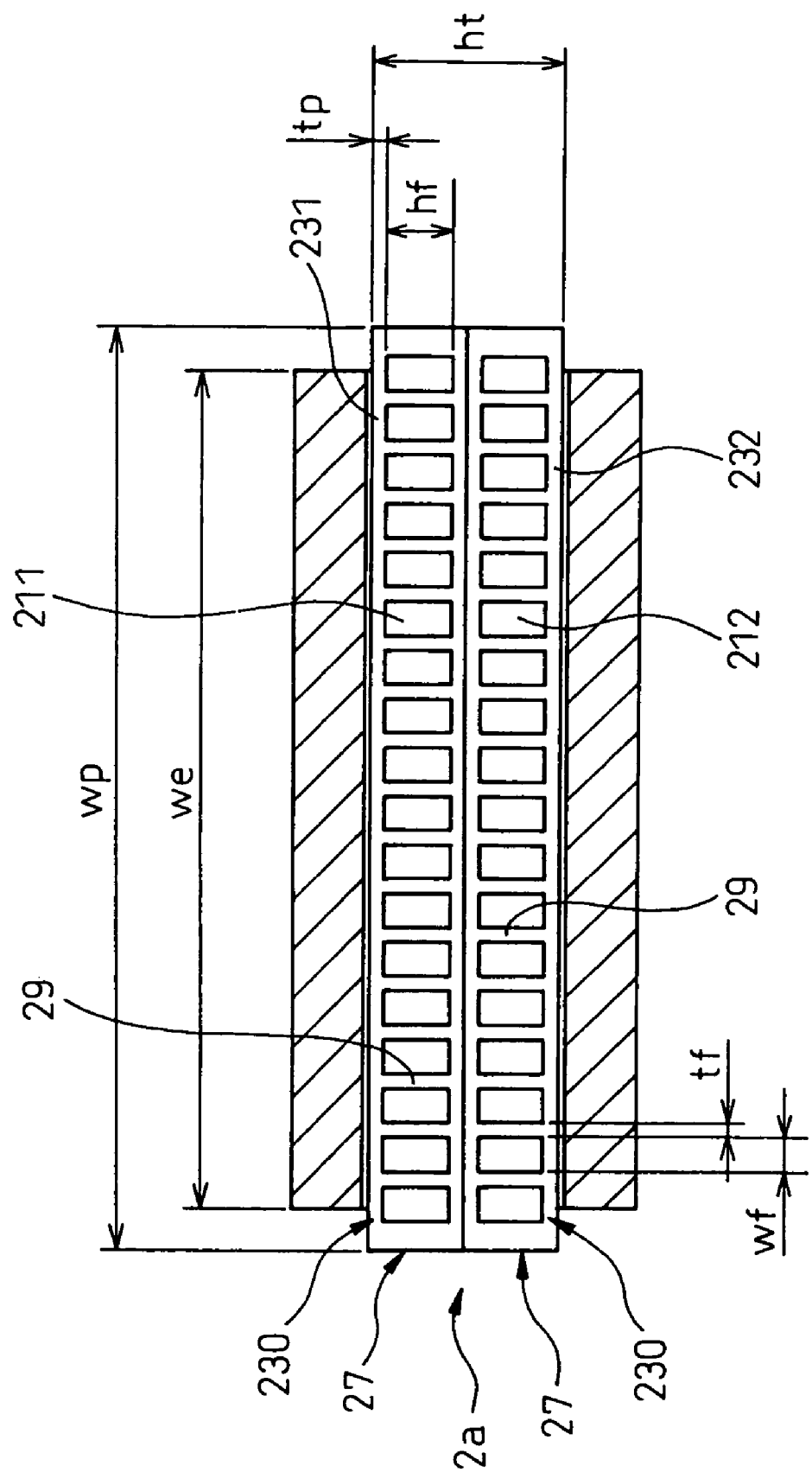
FIG. 10 is a sectional view of an inside cooling tube in Embodiment 5.

This embodiment explains in more detail the dimensional relation of the inside cooling tube 2a in Embodiment 2 (FIG. 4) as shown in FIG. 10.

As shown in the drawing, the inside cooling tube 2a of this embodiment is produced by stacking and bonding a plurality of flat extrusion molding tubes 27 each integrally having a flat outer profile portion 230 including a first tube wall 231 or a second tube wall 232 and the inner fins 29 dividing the coolant flow passages 211 and 212 inside the outer profile portion 230 into a plurality of zones.

The electronic component 6 to be cooled is assumed as having calorific output of 400 W/piece.

Each part has the following dimensional relation as shown in FIG. 10.

First, a flow passage width wf of two adjacent inner fins 29 is smaller than the height hf of the inner fins 29.

The flow passage width wf of the inner fin 29 is 1.5 mm or below.

The height hf of the inner fin 29 is within the range of 1 to 5 mm.

The thickness tf of the inner fin 29 is smaller than the thickness tp of the first and second tube walls 231 and 232.

The thickness of tf of the inner fin 29 is within the range of 0.03 to 1.0 mm.

The thickness tp of the first and second tube walls 231 and 232 is within the range of 0.1 to 5.0 mm.

Furthermore, the width wp of the flat portions of the first and second tube walls 231 and 232 is greater than the width we of the electronic component 6.

More concretely, the values are set to the following values, i.e. flow passage width wf of inner fin 29, wf=0.9 mm, height hf=1.8, thickness tf=0.2 mm and thickness tp of first and second tube walls 231 and 232, tp=0.4 mm.

Because the inside cooling tube 2a of this embodiment satisfies all the dimensional relations described above, the same functions and effects as those of Embodiments 1 and 2 can be more reliably exhibited.

Embodiment 6

Figure 11:
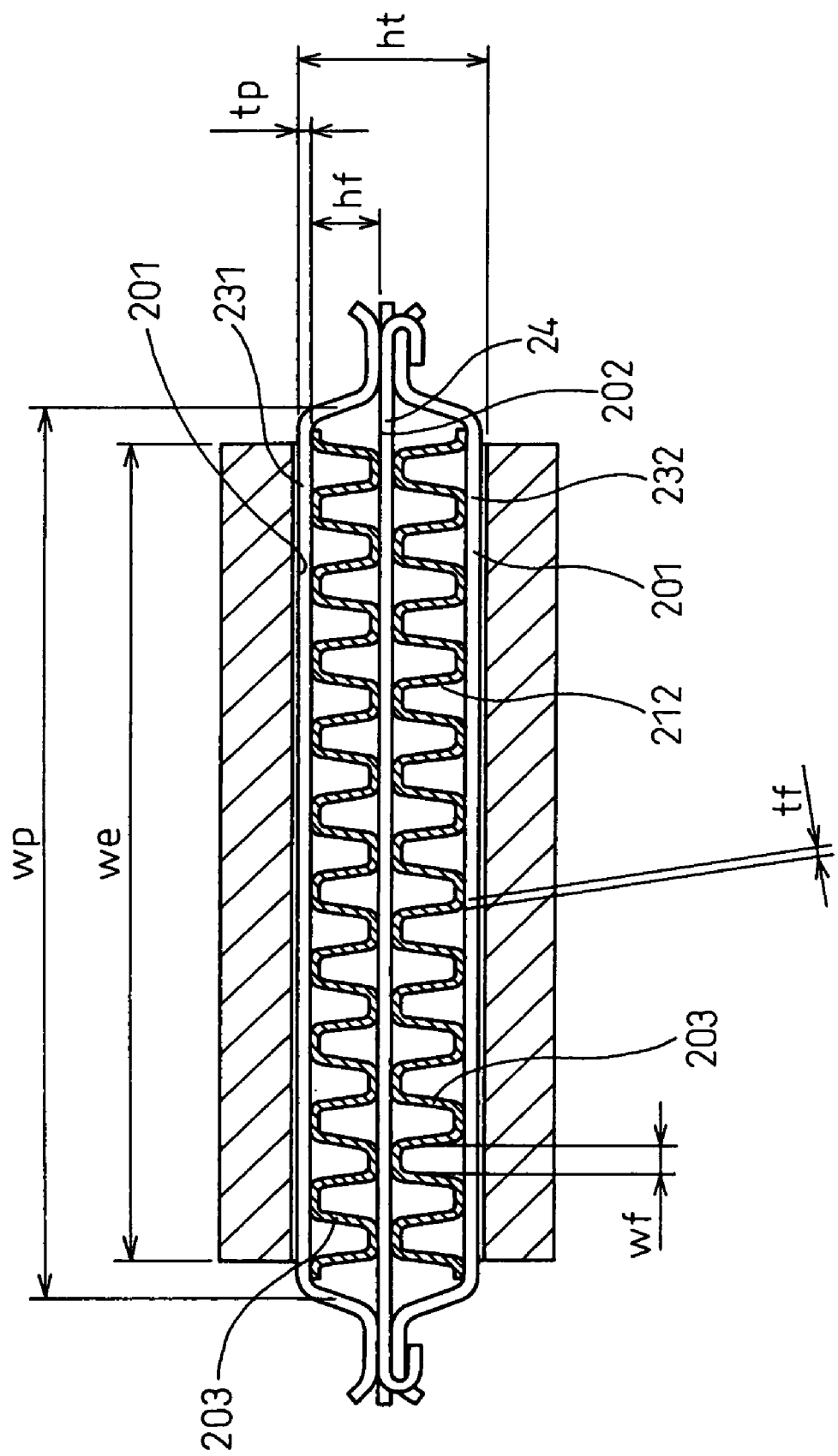
FIG. 11 is a sectional view of an inside cooling tube in Embodiment 6.

This embodiment explains in further detail the dimensional relation of the inside cooling tube 2a in Embodiment 3 (FIG. 6) as shown in FIG. 11.

As shown in the drawing, the inside cooling tube 2a of this embodiment has a drone cup structure.

In other words, the inside cooling tube 2a includes a pair of outer shell plates 201 constituting the first and second tube walls 231 and 232, an intermediate plate 202 interposed between the pair of outer shell plates 201 and constituting the intermediate wall 24 and an inner fin 203 interposed between the intermediate plate 202 and the outer shell plate 201.

Each part has the following dimensional relation as shown in FIG. 11.

First, a flow passage width wf of two adjacent inner fins 203 is smaller than the height hf of the inner fin 203. Here, the flow passage width wf of the two adjacent inner fins 203 represents the width of the center in the direction of height exactly as the mean value as shown in the drawing.

The flow passage width wf of the inner fin 203 is 1.5 mm or below.

The height hf of the inner fin 203 is within the range of 1 to 5 mm.

The thickness tf of the inner fin 203 is smaller than the thickness tp of the first and second tube walls 231 and 232.

The thickness of tf of the inner fin 203 is within the range of 0.03 to 1.0 mm.

The thickness tp of the first and second tube walls 231 and 232 is within the range of 0.1 to 5.0 mm.

Furthermore, the width wp of the flat portions of the first and second tube walls 231 and 232 is greater than the width we of the electronic component 6.

More concretely, the values are set to the following values in the same way as in Embodiment 5, i.e. flow passage width wf of inner fin 203, wf=0.9 mm, height hf=1.8, thickness tf=0.2 mm and the thickness tp of first and second tube walls 231 and 232, tp=0.4 mm.

Because the inside cooling tube 2a of this embodiment satisfies all the dimensional relations described above, the same functions and effects as those of Embodiments 3 and 4 can be more reliably exhibited.

Embodiment 7

This embodiment represents the example in which the inside cooling tube 2a having the drone cup structure shown in Embodiment 6 is used, and the relation between the dimension described above and the cooling capacity is examined.

First, the cooling capacity is examined while the height hf of the inner fin 203, its thickness tf and the thickness tp of the first and second tube walls 231 and 232 are fixed at hf=1.8 mm, tf=0.2 mm and tp=0.4 mm, respectively but the flow passage width wf of the inner fin 203 is changed. The cooling capacity is judged by calculating the surface temperature Tw of the first tube wall 231 of the inside cooling tube 2a keeping contact with the electronic component 6. The lower the surface temperature Tw, the higher is judged the cooling capacity. The electronic component 6 having calorific power of 400 W/piece is used and the rest of the constructions are the same as that of Embodiment 3.

To set up a standard, the surface temperature Tw is set to 110° C. or below as a target value on the basis of the empirical result, too.

Figure 12:
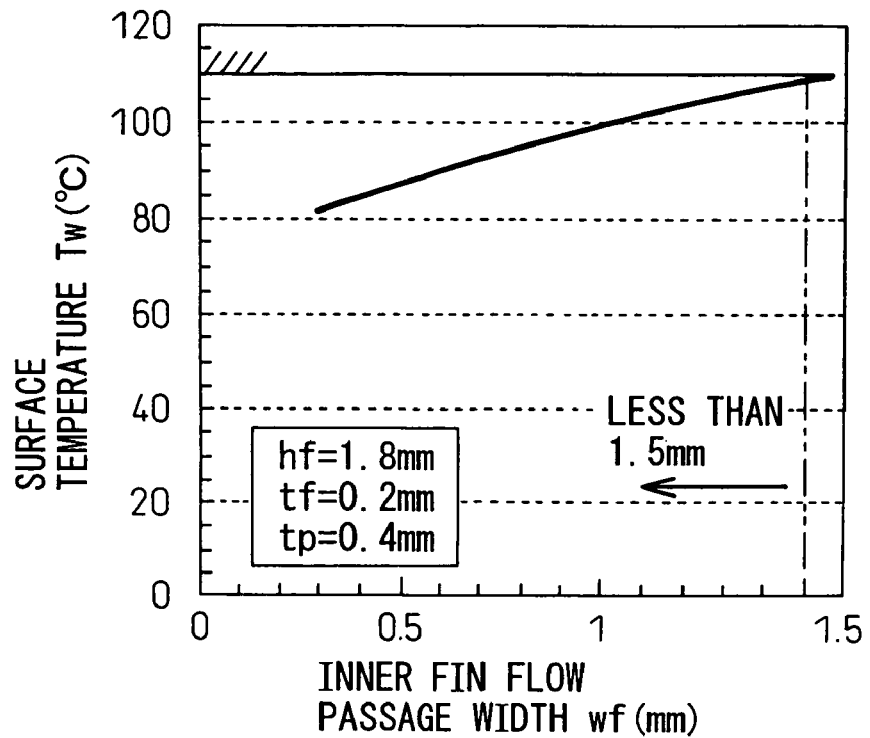
FIG. 12 is an explanatory view showing the relation between an inner fin flow passage width wf and a surface temperature Tw.

FIG. 12 shows the examination result. The abscissa represents the flow passage width wf (mm) of the inner fin and the ordinate does the surface temperature Tw (° C.) of the inside cooling tube.

It can be understood from the diagram that the target cooling capacity can be exhibited when the flow passage width wf of the inner fin is set to 1.5 mm or below.

Next, the cooling capacity is examined while the flow passage width wf of the inner fin 203, its thickness tf and the thickness tp of the first and second tube walls 231 and 232 are fixed at wf=0.9 mm, tf=0.2 mm and tp=0.4 mm, respectively, but the height hf of the inner fin 203 is changed. The rest are the same as those described above.

Figure 13:
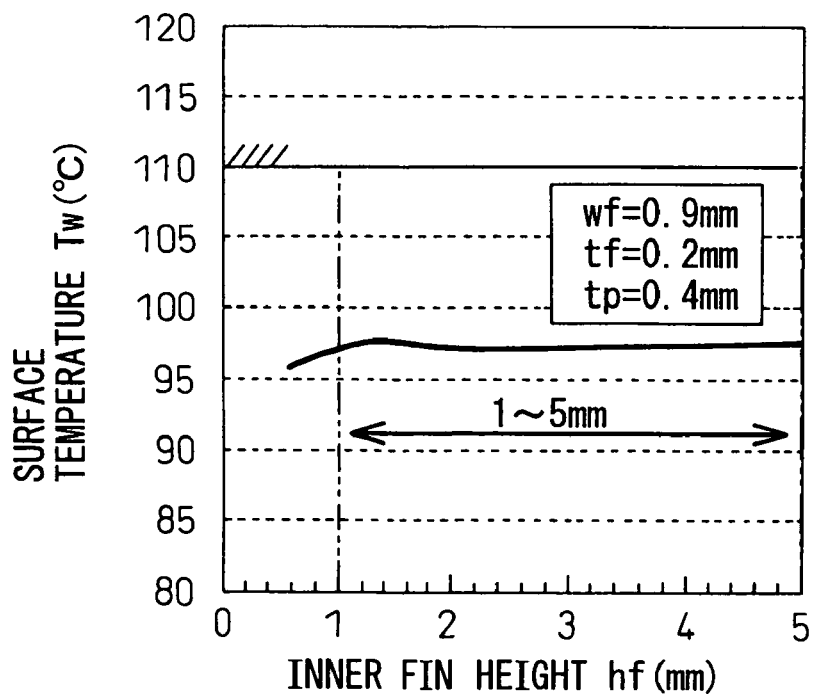
FIG. 13 is an explanatory view showing the relation between an inner fin height hf and a surface temperature Tw.

FIG. 13 shows the examination result. The abscissa represents the height hf (mm) of the inner fin and the ordinate does the surface temperature Tw (° C.) of the inside cooling tube.

It can be understood from the diagram that adverse influences on the cooling capacity do not occur at least when the height hf of the inner fin is set to 5 mm or below as the range of examination of the specification. Incidentally, when the height hf is less than 1 mm, clogging by foreign matter and a structural problem are likely to occur. Therefore, the height hf is preferably within at least 1 to 5 mm.

Next, the cooling capacity is examined while the flow passage width wf of the inner fin 203, its height hf and the thickness tp of the first and second tube walls 231 and 232 are fixed at wf=0.9 mm, hf=1.8 mm and tp=0.4 mm, respectively, but the thickness tf of the inner fin 203 is changed. The rest are the same as described above.

Figure 14:
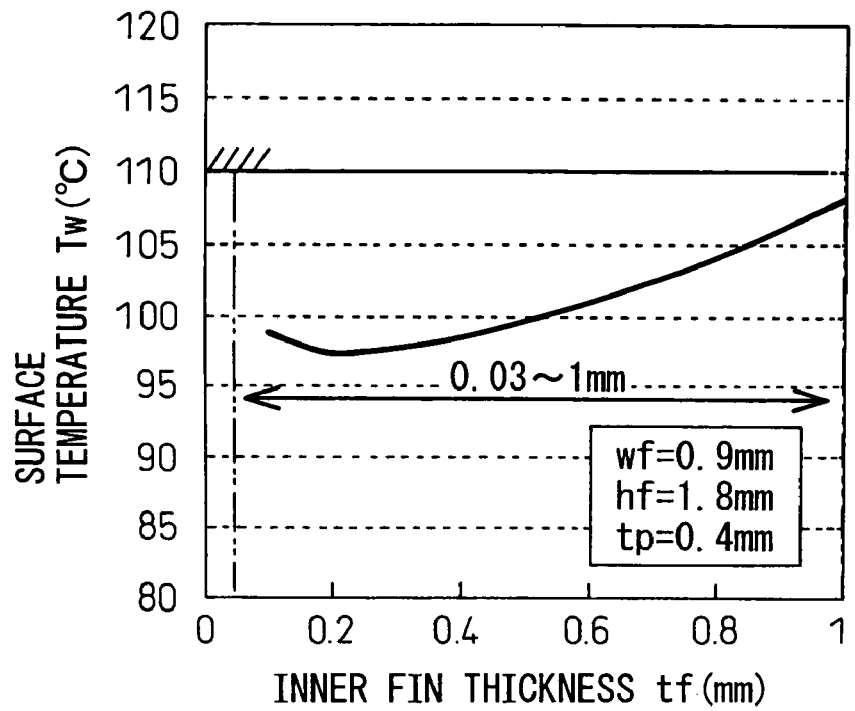
FIG. 14 is an explanatory view showing the relation between an inner fin thickness tf and a surface temperature Tw.

FIG. 14 shows the examination result. The abscissa represents the thickness tf (mm) of the inner fin and the ordinate does the surface temperature Tw (° C.) of the inside cooling tube.

It can be understood from the diagram that the cooling capacity is sufficient at least when the thickness tf of the inner fin is set to 1 mm or below as the range of examination of the specification and the cooling capacity can be improved particularly when the thickness is as small as possible. However, it is difficult to set the thickness of the inner fin to 0.03 mm or below from the structural limit and the problem of production, and the thickness tf is preferably within at least 0.03 to 1 mm.

Next, the cooling capacity is examined while the flow passage width wf of the inner fin 203, its height hf and its thickness tp are fixed at wf=0.9 mm, hf=1.8 mm and tf=0.2 mm, but the thickness tp (plate thickness) of the first and second tube walls 231 and 232 is changed. The rest are the same as described above.

Figure 15:
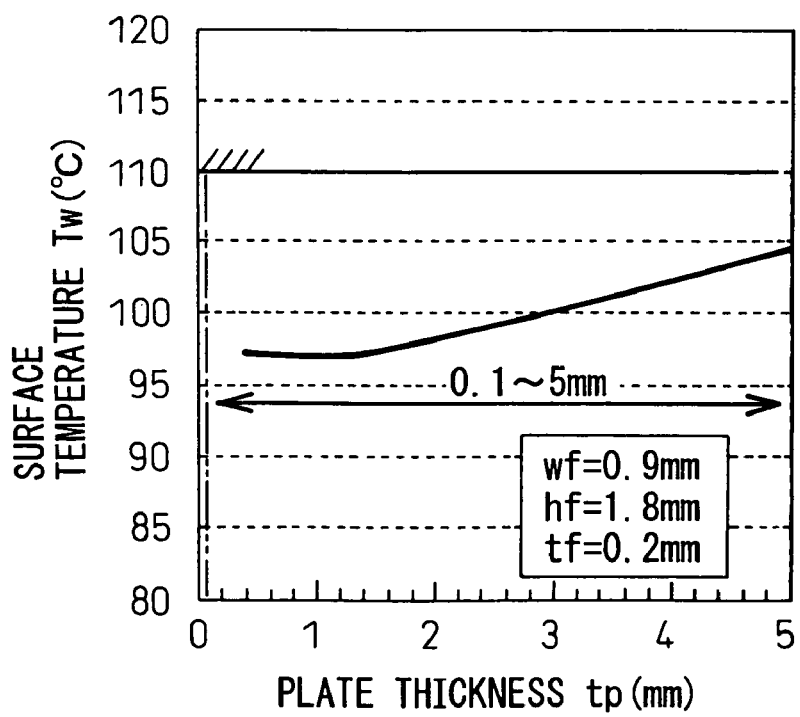
FIG. 15 is an explanatory view showing the relation between plate sheet thickness tp and a surface temperature Tw.

FIG. 15 shows the examination result. The abscissa represents the thickness tp (mm) of the first and second tube walls (plate thickness) and the ordinate represents the surface temperature Tw (° C.) of the inside cooling tube.

It can be understood from the diagram that the cooling capacity is sufficient at least when the thickness tp is set to 5 mm or below as the range of examination of the specification and the cooling capacity can be improved particularly when the thickness is as small as possible. However, it is difficult to set the thickness to 0.1 mm or below from the problem of adhesion with the electronic component and the problem of production, and the thickness tp is preferably within at least 0.1 to 5 mm.

Embodiment 8

This embodiment represents a modified example of the drone cup structure of Embodiment 3 as shown in FIGS. 16 to 19.

Figure 16:
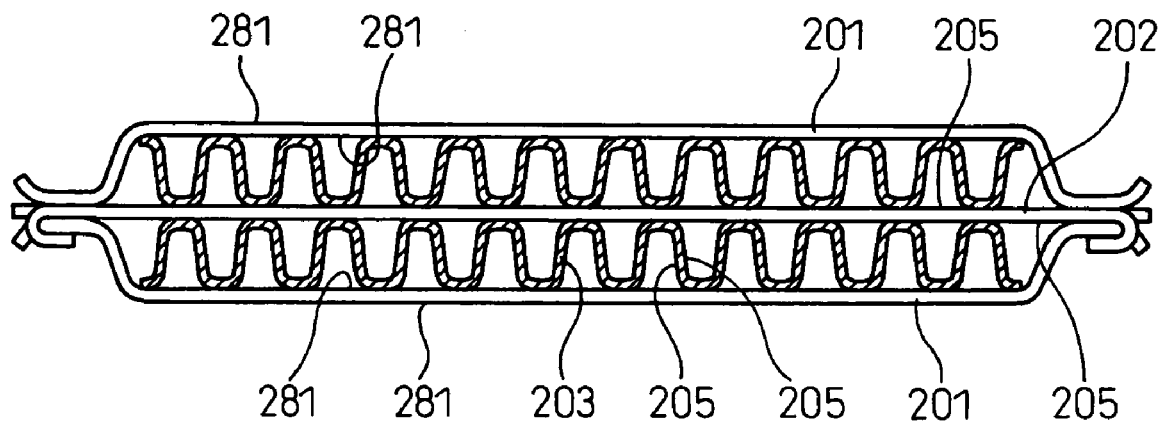
FIG. 16 is a sectional view of an inside cooling tube in Embodiment 8.

In the inside cooling tube 2*a* shown in FIG. 16, a pair of outer shell plates 201 is formed of a bare material of aluminum and has a bare surface 281. The inner surfaces of the pair of outer shell plates at the end portions are bonded to both surfaces of the end portions of the intermediate plate. The intermediate plate 202 is formed of a brazing sheet producing by depositing a brazing material 205 on both surfaces of a core material of aluminum not containing Zn. The inner fin 203 uses an aluminum material containing Zn as the core material, and the brazing material 205 is deposited to both surfaces to form the brazing sheet.

In this case, because the surface of the outer shell plate 201 is the bare surface 281, the plate surface (surface of cooling tube) does not become coarse due to brazing and the contact condition of the electronic component becomes satisfactory. Because the Zn-containing aluminum material is used as the core material of the inner fin 203, it becomes possible to suppress the formation of holes in the outer shell plate 201 as the inner plate 203 becomes potentially baser than the outer shell plate 201 and is more preferentially corroded.

Figure 17:
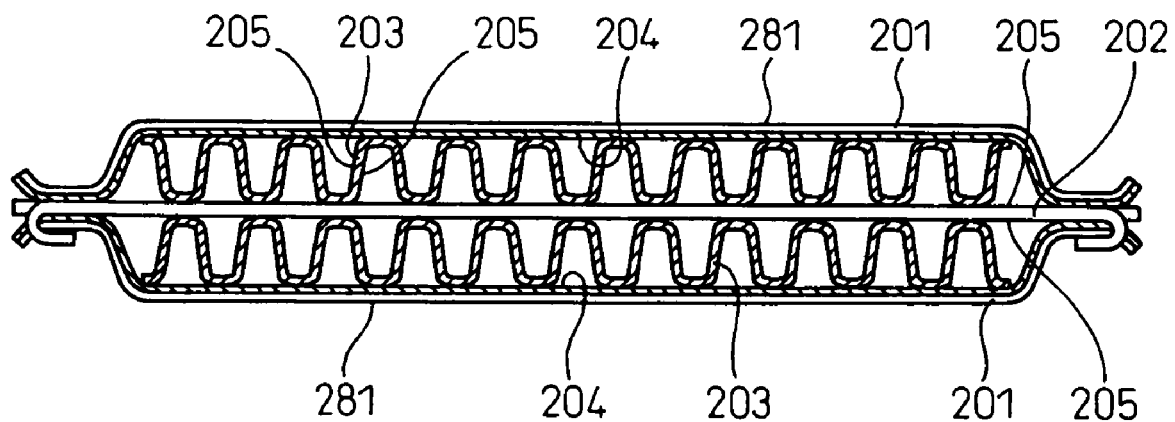
FIG. 17 is a sectional view of an inside cooling tube in Embodiment 8.

In the inside cooling tube 2*a* of the type shown in FIG. 17, the pair of outer shell plates 201 is formed of the core material having the bare surface 281 of aluminum on its outer surface and a sacrificial anode material 204 is arranged on the inner surface. The construction of the intermediate plate 202 and the inner fin 203 is the same as that of the type shown in FIG. 16.

In this case, the corrosion resistance of the outer shell plate 201 can be improved much more than the type shown in FIG. 16. In other words, the sacrificial anode material 204 deposited to the inner surface of the outer shell pate 201 is selectively corroded and corrosion of the core material of the outer shell plate 201 can be suppressed.

Figure 18:
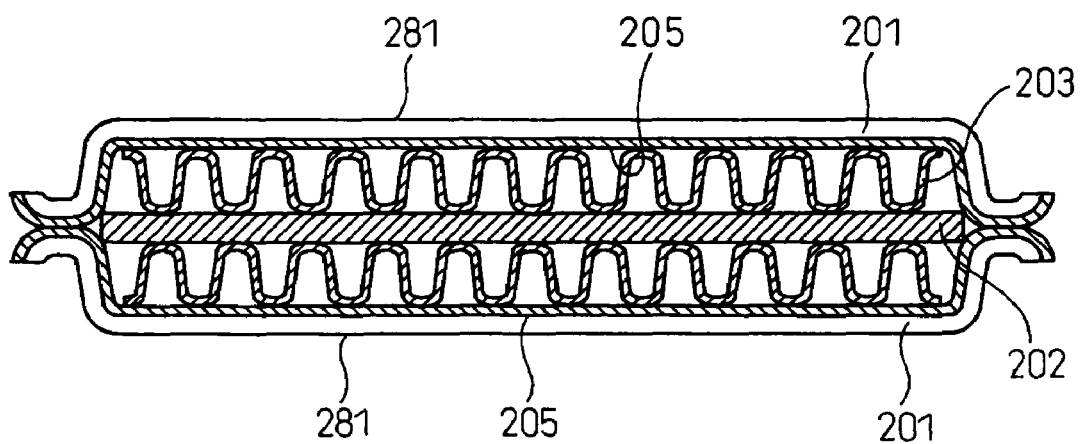
FIG. 18 is a sectional view of an inside cooling tube in Embodiment 8.

In the inside cooling tube 2*a* of the type shown in FIG. 18, a pair of outer shell plates 201 is formed of a core material having a bare surface 281 of aluminum on its outer surface and a brazing material 205 is arranged on the inner surface. The inner surfaces at the end portions of the pair of outer shell plates are bonded to each other. The intermediate plate 202 uses a Zn-containing aluminum material as the core material. The construction of the inner fin 203 is the same as that of the types shown in FIGS. 16 and 17.

The outer shell plates 201 described so far form a pair of upper and lower plates. In order not to sandwich the intermediate plate 202, the upper and lower outer shell plates 201 may be integrally processed and may be bent at one of their ends, and the inner surfaces of the remaining end portion are bonded to each other.

In this case, the intermediate plate 202 need not be sandwiched between the outer shell plates 201. Therefore, the production becomes easier, the bonding structure of the outer shell plates 201 can be simplified and reliability of the joint portion can be improved.

Figure 19:
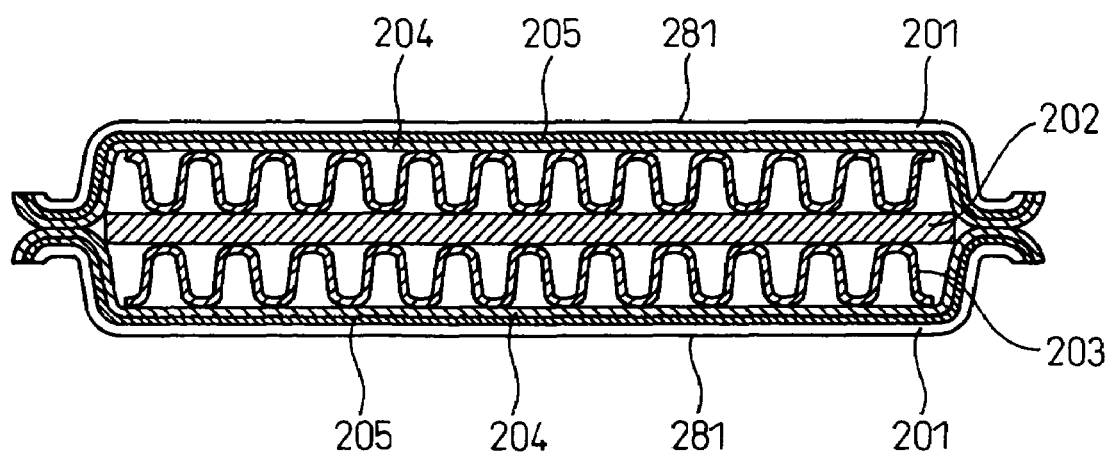
FIG. 19 is a sectional view of an inside cooling tube in Embodiment 8.
Figure 20:
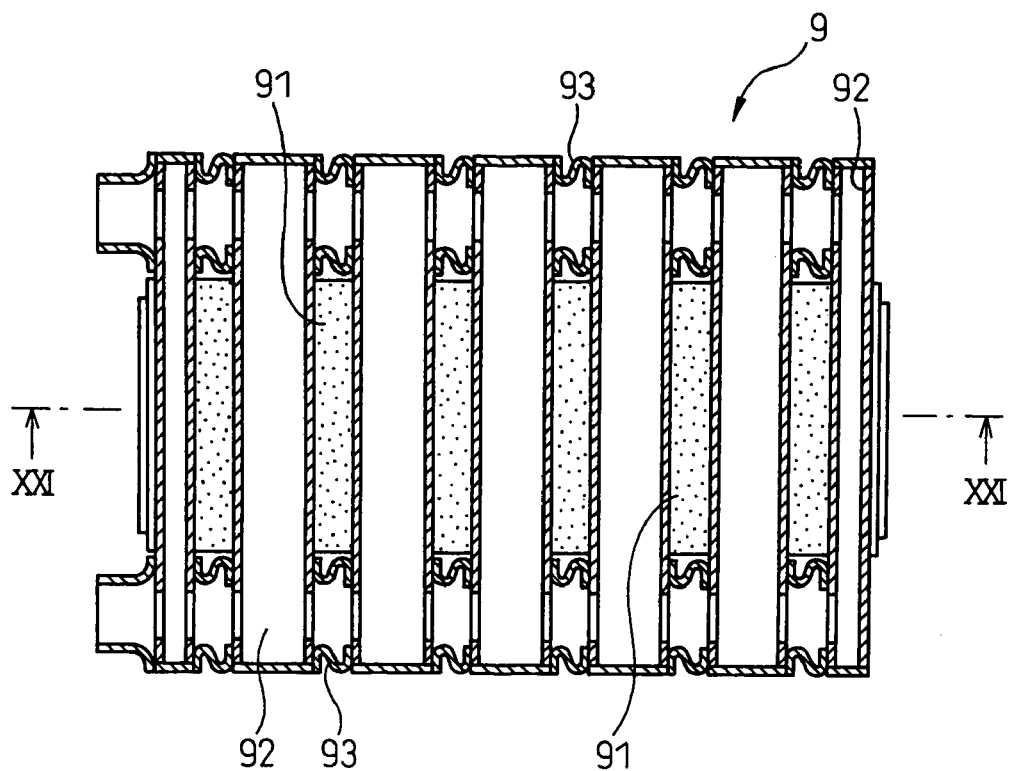
FIG. 20 is a horizontal sectional view of a stacked type cooler according to a prior art example.
Figure 21:
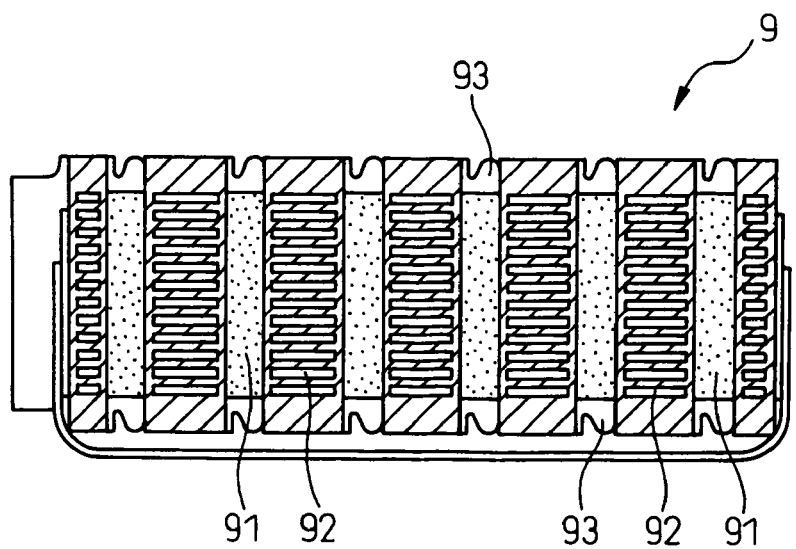
FIG. 21 is a sectional view taken along a line XXI-XXI in FIG. 20.

In the inside cooling tube 2*a* of the type shown in FIG. 19, a pair of outer shell plates 201 is formed of a core material having a bare surface 281 of aluminum on its outer surface and a sacrifice anode material 204 and a brazing material 205 are arranged on the inner surface. The rest are the same as those of the type shown in FIG. 18.

In addition to the effects described above, the embodiment provides in this case the effect that after the intermediate plate 202 and the inner fin 203 are corroded, the sacrifice anode material 204 arranged on the inner surface of the outer shell plates 201 is selectively corroded and the formation of holes of the outer shell plates 201 can be much more suppressed.

Embodiment 9

Figure 22:
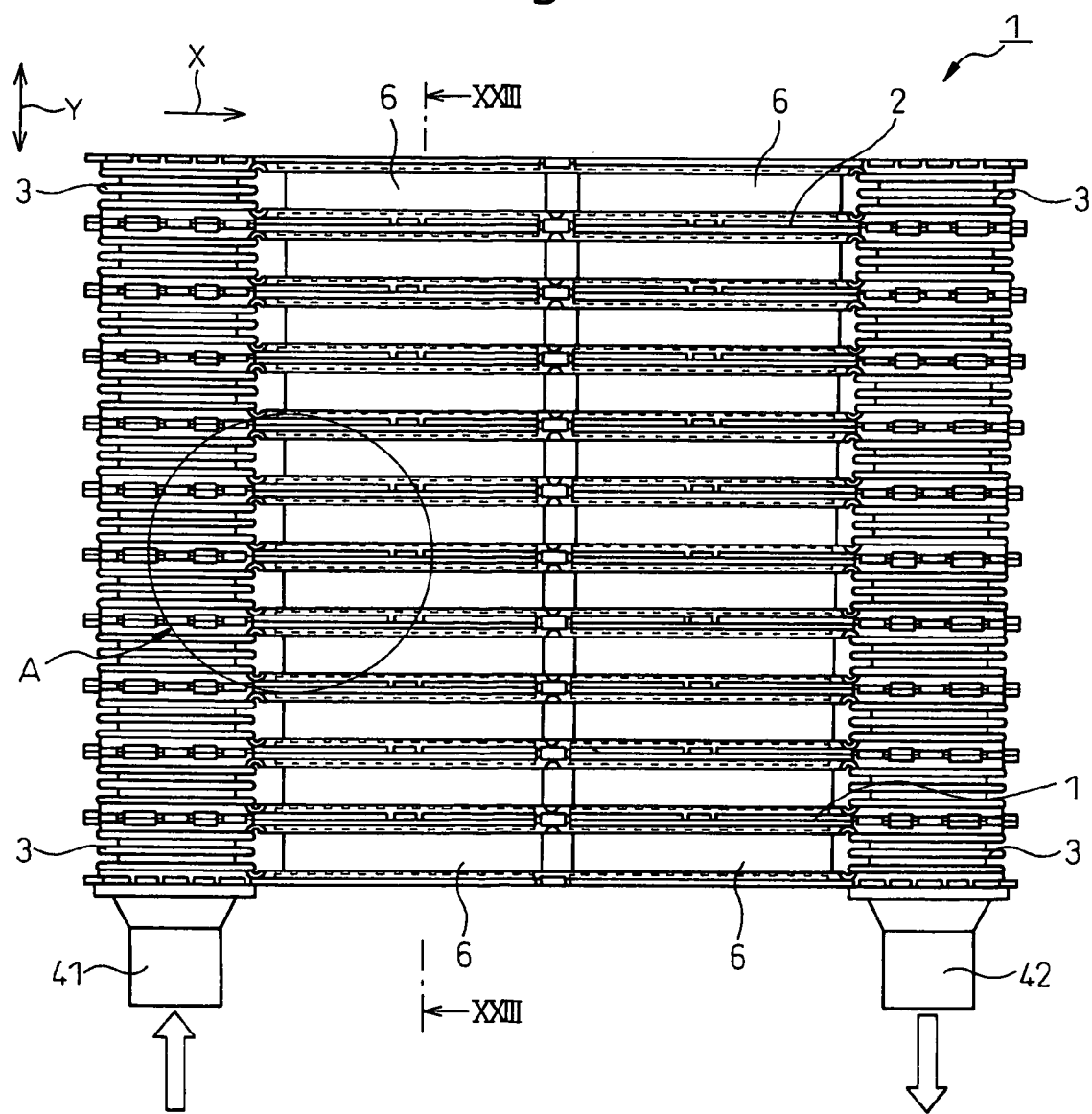
FIG. 22 is a front view of a cooler according to Embodiment 9 of the invention.
Figure 23:
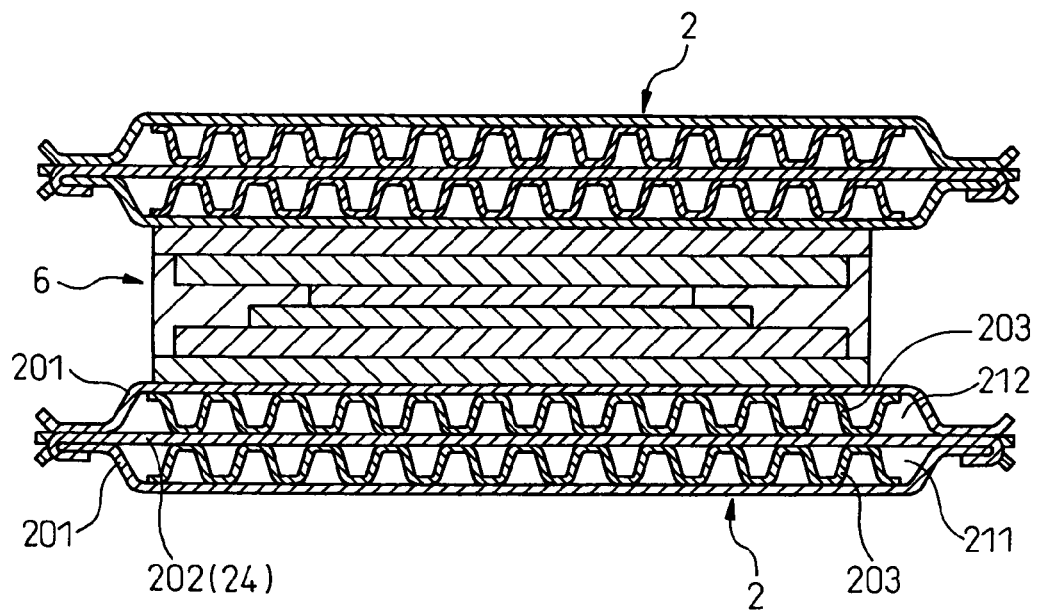
FIG. 23 is a sectional view of principal portions taken along a line XXIII-XXIII in FIG. 22.
Figure 24:
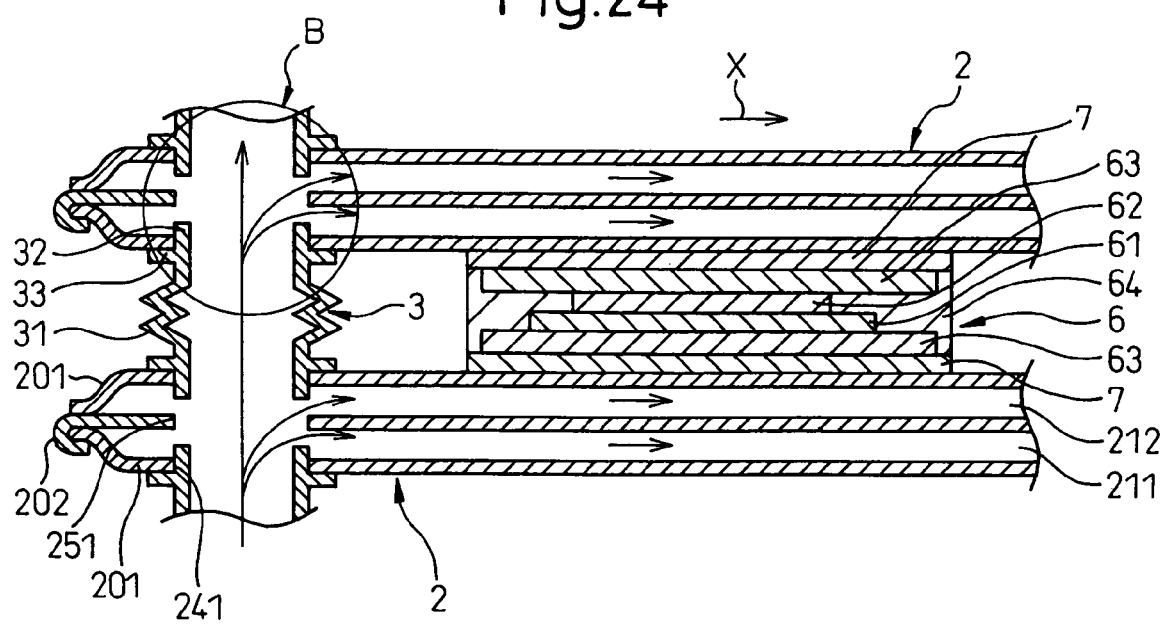
FIG. 24 is a sectional front view of an A portion in FIG. 22.
Figure 25:
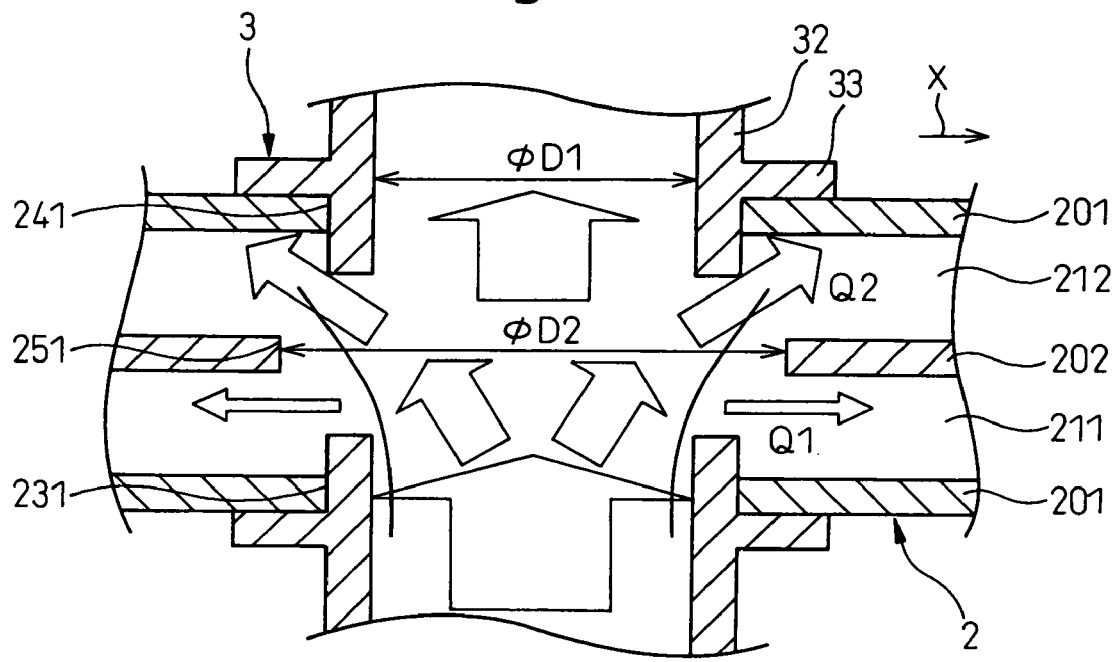
FIG. 25 is an enlarged sectional front view of a B portion in FIG. 24.

A cooler according to the ninth embodiment of the invention will be explained. FIG. 22 is a front view of the cooler according to the ninth embodiment. FIG. 23 is a sectional view of principal portion taken along a line XXII-XXII of FIG. 1. FIG. 24 is a sectional front view of an A portion in FIG. 22 and FIG. 25 is an enlarged sectional front view of a B portion in FIG. 24.

The cooler of this embodiment can be used for cooling a double-surface cooling type semiconductor module of an inverter for a hybrid electric car.

As shown in FIGS. 22 to 24, the cooler 1 includes a large number of cooling tubes 2 having coolant flow passages 211 and 212, through which a coolant flows, stacked with predetermined gaps between them in a direction Y (hereinafter called "stacking direction Y") intersecting the flowing direction X (hereinafter called "flowing direction X") of the coolant inside the coolant flow passages 211 and 212, connecting pipes 3 arranged between adjacent cooling tubes 2 and connecting the adjacent cooling tubes 2 to each other, and an inlet pipe 41 into which the coolant flows and an outlet pipe 42 which is brazed to the cooling tube 2 positioned at one of the ends in the stacking direction Y and from which the coolant flows out. This embodiment uses water mixed with an ethylene glycol type antifreezing solution as the coolant.

Each cooling tube 2 is produced by putting together two outer shell plates 201 into a flat shape in such a fashion as to define a space therein. A flat intermediate plate 202 (24) sandwiched between two outer shell plates 201 divides this space into a first coolant flow passage 211 and a second coolant flow passage 212 that are aligned in the stacking direction Y. Fins 203 having a corrugation sheet shape are arranged in the coolant flow passages 211 and 212 to promote heat exchange.

Each plate 201, 202 and the fin 203 are formed by press-molding an aluminum thin sheet. A brazing sheet material equipped therein with a sacrificial anode material is preferably used to prevent the formation of holes.

A circular insertion port 241 into which a cylinder portion (detail of which will be described later) of connecting pipe 3 is fitted is formed at each end of the outer shell plate 201 in the flowing direction of the coolant inside the coolant flow passage 211, 212. Communication ports 251 for communicating the first coolant flow passage 211 and the second coolant flow passage 212 are formed at positions of the intermediate plate 202 opposing the insertion ports 241. Incidentally, the intermediate plate 202 corresponds to the intermediate wall 24 of the invention and the communication port 251 corresponds to the intermediate wall hole of the invention.

The connecting pipe 3 is a bellows-like pipe and includes a bellows portion 31 capable of easily extending and contracting in the stacking direction Y, circular cylinder portions 32 disposed at both ends of the bellows portion 31, and flange portion 33 disposed around the outer peripheral portion of the cylinder portions 32. The connecting pipe 3 are formed of aluminum. The cylinder portions 32 are inserted and bonded to the insertion ports 241 of two adjacent cooling tubes 2.

Both inlet pipe 41 and outlet pipe 42 are formed of aluminum, are inserted into the insertion ports 241 positioned on one of the end sides in the stacking direction Y and are brazed to the cooling tubes 2. The inlet pipe 41 and the outlet pipe 42 are connected to a pump, not shown, for circulating the coolant and to a heat exchanger, not shown, for cooling the coolant.

The double surface cooling type semiconductor module 6 as the heat generation member corresponds to the electronic component of the invention and is formed by integrating an IGBT element 61, a copper plate 62 and a heat radiation plate 63 with a mold resin 64. The semiconductor module 6 is arranged between the two cooling tubes 2 and is in contact with the cooling tubes 2 through the insulating material (mainly a ceramic plate) and a heat-conductive grease. Incidentally, the semiconductor module 6 may be brought into direct contact with the cooling tubes 2. Because leaf springs, not shown, clamp the stacked cooling tubes 2 from both ends of the stacking direction Y, the semiconductor module 6 is held between the cooling tubes 2.

FIG. 25 shows the inlet side of the coolant in the cooling tube 2. The inner diameter φD1 of the cylinder portion 32 of the connecting pipe 3 and the inner diameter φD2 of the communication hole 251 of the intermediate plate 202 are different on this coolant inlet side. More concretely, the inner diameter φD2 of the communication hole 251 is greater than the inner diameter φD1 of the cylinder portion 32. Incidentally, the connecting pipe 3 corresponds to the connecting pipe of the invention.

In the construction described above, the coolant flowing from the inlet pipe 41 flows into one of the ends of the coolant flow passage 211, 212 of each cooling tube 2 through the connecting pipe 3, flows in the X direction inside the coolant flow passage 211, 212 and reaches the outlet pipe 42 from the other end of the coolant passage 211, 212 through the connecting pipe 3. At this time, heat exchange is conducted between the coolant flowing inside the coolant flow passage 211, 212 and the semiconductor module 6, and the semiconductor module 6 is cooled.

Because the inner diameter φD2 of the communication hole 251 is greater than the inner diameter φD1 of the cylinder portion 32, the coolant flow are quickly expended at the portion at which the coolant is distributed from the connecting pipe 3 to each coolant flow passage 211, 212. Consequently, the coolant does not easily flow into the first coolant flow passage 211 on the upstream side with respect to the flowing direction of the coolant inside the connecting pipe 3 but easily flows in the second coolant flow passage 212 on the downstream side. Therefore, the flow rate Q2 of the coolant flowing through the second coolant flow passage 212 becomes greater than the flow rate Q1 of the coolant flowing through the first coolant flow passage 211 and the cooling capacity becomes higher on the first coolant flow passage 211 side than on the second coolant flow passage 212 side.

The semiconductor module 6 can be efficiently cooled by bringing the surface having greater calorific output (heat radiation amount) in the semiconductor module 6 into conformity with the second coolant flow passage 212 side having the higher cooling capacity and the surface having the smaller calorific power (heat radiation amount) in the semiconductor module 6 into conformity with the first coolant flow passage 211 having the lower cooling capacity.

Figure 26:
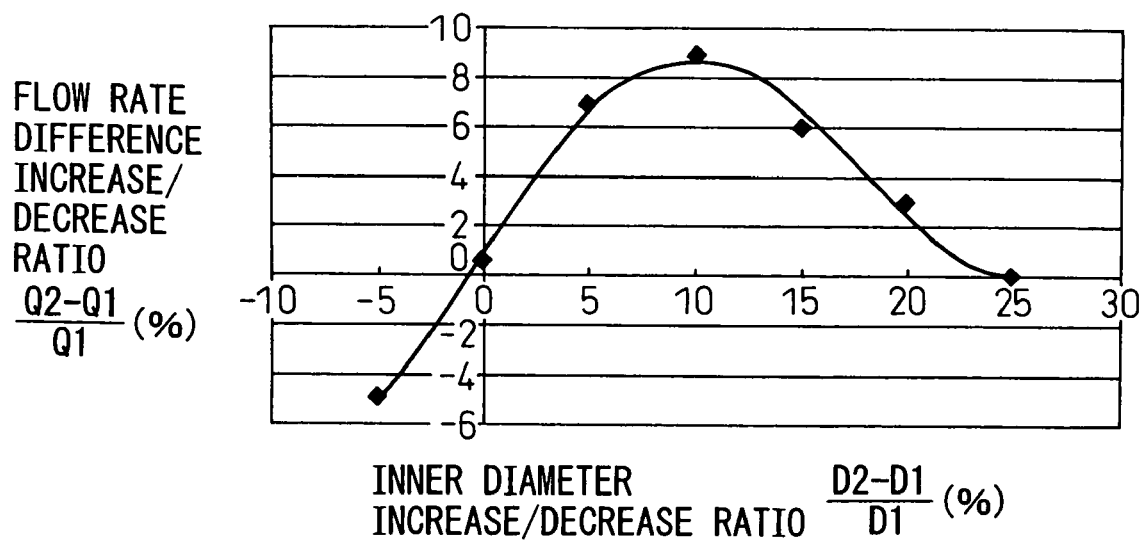
FIG. 26 is a characteristic diagram showing the relation between an inner diameter difference increase/decrease ratio and a flow rate difference increase/decrease ratio.

Incidentally, FIG. 26 shows the relation between the inner diameter difference increase/decrease ratio (D2−D1)/D1 and the flow rate difference increase/decrease ratio (Q2−Q1)/Q1 when the inner diameter φD1 of the cylinder portion 32 is about 20 mm and the coolant is allowed to flow through the cooler at a rate of 12 L/min.

It has been confirmed that when the inner diameter difference increase/decrease ratio is increased by increasing the inner diameter φD2 of the communication hole 251 to a value greater than the inner diameter φD1 of the cylinder portion 32 as shown in FIG. 26, the flow rate difference increase/decrease ratio increases, too, within the range in which the inner diameter difference increase/decrease ratio increases from about 0% to about 10%. However, the flow rate difference does not occur because the flow from the direction of the connecting pipe 3 to the direction of the cooling tube 2 becomes predominant when the inner diameter φD2 of the communication hole 257 is excessively greater than the inner diameter φD1 of the cylinder portion 32.

As described above, the inner diameter φD2 of the communication hole 251 is greater than the inner diameter φD1 of the cylinder portion 32 in this embodiment and the cooling capacity is greater on the side of the second coolant flow passage 212 than the side of the first coolant flow passage 211. Therefore, the semiconductor module 6 can be efficiently cooled by bringing the surface of the semiconductor module 6 having greater calorific power (heat radiation amount) into conformity with the second coolant passage 212 having a greater cooling capacity and the surface of the semiconductor module 6 having smaller calorific power (heat radiation amount) into conformity with the first coolant flow passage 211 having smaller cooling capacity.

The transfer of heat decreases when the temperature rise is substantially equal between the first coolant flow passage 211 and the second coolant flow passage 212 and the occurrence of distortion of the cooling tube 2 resulting from the temperature difference can be prevented. Consequently, reliability (life) of the cooling tube 2 can be improved. Because the surface temperature is thus rendered uniform on both surfaces of the semiconductor module 6, the occurrence of distortion of the semiconductor module 6 resulting from the temperature difference can be prevented and the reliability (the life) of the semiconductor module 6 can be improved.

In comparison with the case where the inner diameter φD2 of the communication hole 251 is smaller than the inner diameter φD1 of the cylinder portion 32, the pressure loss at the communication hole 251 can be made smaller than when the inner diameter φD2 of the communication hole 241 is greater than the inner diameter φD1 of the cylinder portion 32 as in this embodiment.

Embodiment 10

Figure 27:
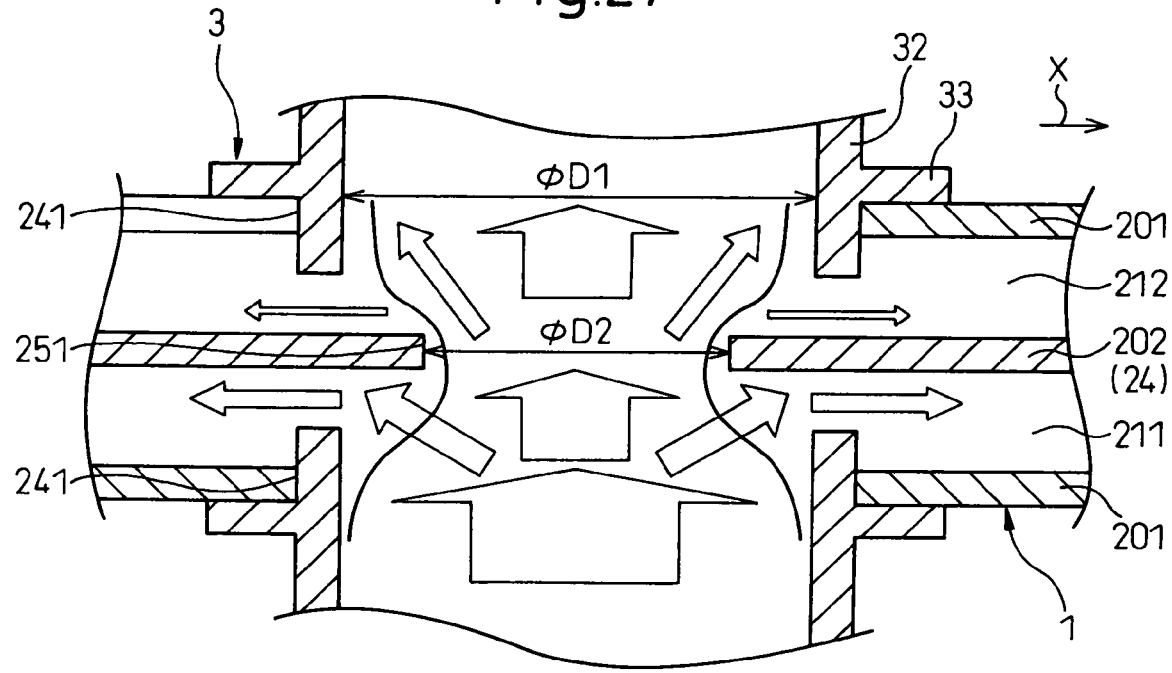
FIG. 27 is a sectional view of principal portions of a cooler according to Embodiment 10 of the invention.

The tenth embodiment of the invention will be explained. FIG. 27 is a sectional view of principal portions of a cooler according to the tenth embodiment of the invention. Like reference numerals will be used to identify like constituent elements as in Embodiment 9 and explanations will be omitted.

In this embodiment, whereas the inner diameter φD2 of the communication hole 251 is greater than the inner diameter φD1 of the cylinder portion 32, the inner diameter φD2 of the communication hole 251 is smaller than the inner diameter φD1 of the cylinder portion 32.

Consequently, the coolant more easily flows through the first coolant flow passage 211 on the upstream side with respect to the flowing direction of the coolant inside the connecting pipe 3 and flows with more difficulty through the second coolant passage 212 on the downstream side. In other words, when the inner diameter φD2 of the communication hole 257 is made smaller than the inner diameter φD1 of the cylinder portion to decrease the inner diameter difference increase/decrease ratio as shown in FIG. 26, the flow rate difference increase/decrease ratio drops, too, when the inner diameter difference increase/decrease ratio drops from about 0% toward the negative side.

Because the cooling capacity is greater in the second coolant flow passage 212 than in the first coolant flow passage 211 in this embodiment, the surface of the semiconductor module 6 having greater calorific output (heat radiation amount) is brought into conformity with the first coolant passage 211 having a greater cooling capacity and the surface of the semiconductor module 6 having smaller calorific power (heat radiation amount) is brought into conformity with the second coolant flow passage 212 having smaller cooling capacity. Consequently, the semiconductor module 6 can be efficiently cooled.

The reliability (the life) of the cooling tube 2 and the semiconductor module 6 can be improved in the same way as in Embodiment 9.

Embodiment 11

Figure 28:
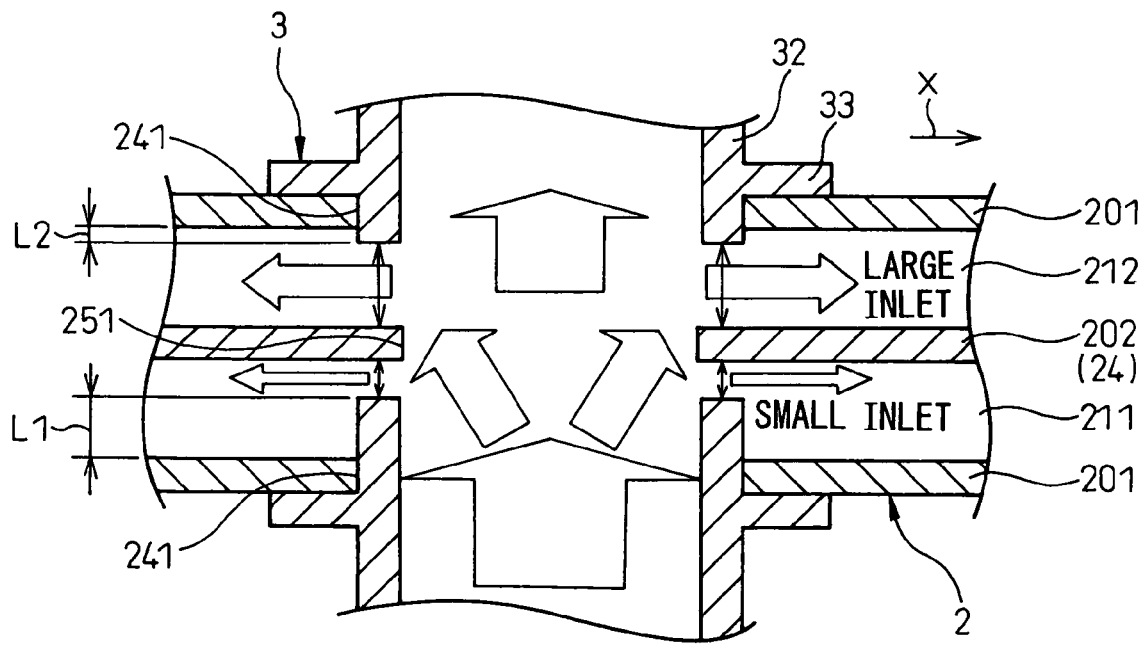
FIG. 28 is a sectional view of principal portions of a cooler according to Embodiment 11 of the invention.

Embodiment 11 of the invention will be explained. FIG. 28 is a sectional view of principal portions of a cooler according to the eleventh embodiment of the invention. Like reference numerals will be used to identify like constituent elements as in Embodiment 9 and the explanation will be omitted.

The projection length L1 of the cylinder portion 32 into the first coolant flow passage 211 and the projection length L2 into the second coolant flow passage 212 are different in this embodiment as shown in FIG. 28 so that the inlet sectional area, that is, the passage sectional area of the portion at which the coolant is distributed from the connecting pipe 3 to the first and second coolant flow passages 211 and 212, becomes different.

Consequently, the flow rate Q1 of the coolant flowing through the first coolant flow passage 211 is different from the flow rate Q2 of the coolant flowing through the second coolant flow passage 212, so that the cooling capacity of the first coolant flow passage 211 can be rendered different from the cooling capacity of the second coolant flow passage 212.

Therefore, the semiconductor module 6 can be efficiently cooled and the reliability (the life) of the cooling tube 2 and the semiconductor module 6 can be improved in the same way as in Embodiment 9.

Other Embodiments

In each of the foregoing embodiments, the cooling capacity of the first coolant flow passage 211 is rendered different from the cooling capacity of the second coolant flow passage 212 by rendering the flow rate Q1 of the coolant flowing through the first coolant flow passage 211 different from the flow rate Q2 of the coolant flowing through the second coolant flow passage 212. However, the cooling capacity on the side of the first coolant flow passage 211 may be rendered different from the cooling capacity on the side of the second coolant flow passage 212 by making the heat exchange performance different between the fins 203 of the first coolant flow passage 211 and the fins 203 of the second coolant flow passage, that is, by arranging high performance fins in either of the coolant flow passages. Incidentally, the high performance fins can be accomplished by forming very fine flow passage or by enlarging the heat transfer area or by employing offset fins.

The cooling capacity of the first coolant flow passage 211 may be rendered different from that of the second coolant flow passage 212 by arranging the fin 203 in only one of the first and second coolant flow passages 211 and 212.

Though each of the foregoing embodiments uses water mixed with the ethylene glycol-type antifreeze solution as the coolant, it is also possible to use natural coolants such as water and ammonia, fluorocarbon type coolants such as fluorinate, fron type coolants such HCFC123 and HFC134, alcohol type coolants such as methanol and alcohol, and ketone type coolants such as acetone.

In the foregoing embodiments, the invention is applied to cooling of the double-face cooling type semiconductor module for the inverter of the hybrid electric motor, but can be similarly applied to cooling of semiconductor modules such as motor driving inverters of industrial equipment and air conditioner inverters for air-conditioning of buildings.

The cooler according to the invention can cool not only the semiconductor module 6, but also electronic components such as power transistors, power FETs, IGBTs, and so forth.

While the invention has been described by reference to specific embodiments chosen for purposes of illustration, it should be apparent that numerous modifications could be made thereto, by those skilled in the art, without departing from the basic concept and scope of the invention.

The invention claimed is:

1. A stacked type cooler for cooling a plurality of electronic components from two surfaces of each component, including a plurality of cooling tubes having a flat shape and coolant flow passages for allowing a coolant to flow, and a connecting pipe for connecting said plurality of cooling tubes, wherein:

said plurality of cooling tubes are arranged and stacked in such a fashion as to interpose said electronic components between said cooling tubes and include two outside cooling tubes arranged at both ends in a stacking direction and a plurality of inside cooling tubes arranged between said two outside cooling tubes;

each of said inside cooling tubes includes at least a first coolant flow passage facing a first tube wall having a first main surface in contact with one of said electronic components and a second coolant flow passage facing a second tube wall having a second main surface in contact with another one of said electronic components on the opposite side to said first main surface, and said coolant flow passages are formed in two or more stages in a direction of thickness of said inside cooling tube;

each of said inside cooling tubes has an inner fin for partitioning said coolant flow passages into a plurality of zones in a direction intersecting at right angles to the direction of thickness of said inside cooling tube;

each of said inside cooling tubes includes a pair of outer shell plates constituting said first tube wall and said second tube wall, an intermediate plate interposed between said pair of outer shell plates and said inner fin has a corrugation shape and is interposed between said intermediate plate and said outer shell plate, and said first coolant flow passage and said second coolant flow passage are formed between said intermediate plate and said outer shell plates, respectively;

each of the first and second coolant flow passages have an upper stream side inner fin disposed at an upper stream side of the coolant flow and a lower stream side inner fin disposed at a lower side of the coolant flow; and a gap is formed between the upper stream side inner fin and the lower stream side inner fin in a coolant flow direction.

2. The stacked type cooler as defined in claim 1, wherein said coolant flow passages of the two or more stages disposed in said inside cooling tube are partitioned from each other by an intermediate wall arranged between said first and second tube walls.

3. The stacked type cooler as defined in claim 1, wherein said inner fin is formed in an entire area in which at least one of said electronic components is in contact with said cooling tube.

4. The stacked type cooler as defined in claim 1, wherein said outer shell plate has a core material made of a metal material and has, on an outer surface thereof, a bare surface exposing the metal material constituting said core material.

5. The stacked type cooler as defined in claim 1, wherein said outer shell plate is formed of a brazing sheet having a sacrificial anode material on an inner surface of said core material.

6. The stacked type cooler as defined in claim 5, wherein said outer shell plate has a three-layered structure in which a brazing material is further arranged on said sacrificial anode material arranged on the inner surface of said core material.

7. The stacked type cooler as defined in claim 1, wherein said outer shell plate is formed of a brazing sheet having a brazing material on the inner surface of said core material.

8. The stacked type cooler as defined in claim 1, wherein said inner fin is made of a material that is potentially baser than the core material of said outer shell plate.

9. The stacked type cooler as defined in claim 8, wherein said inner fin is formed of a brazing sheet having a brazing material arranged on both surfaces of said core material.

10. The stacked type cooler as defined in claim 1, wherein said intermediate plate includes a brazing sheet having a core material and a brazing material arranged on both surfaces of said core material, and inner surfaces of said pair of outer shell plates at the end portions are bonded to both surfaces of said intermediate plate at end portions thereof.

11. The stacked type cooler as defined in claim 1, wherein said intermediate plate is made of a material that is potentially baser than the core material of said outer shell plate, and inner surfaces of said pair of outer shell plates at end portions are mutually bonded.

12. The stacked type cooler as defined in claim 1, wherein said inner fin is constituted by offset fins that are formed by dividing said inner fin into a plurality of segments in a longitudinal direction and arranging a large number of corrugated segments while the positions of crests thereof are arranged in a zigzag shape.

13. The stacked type cooler as defined in claim 1, wherein a flow passage width of said inner fin is smaller than a height hf of said inner fin.

14. The stacked type cooler as defined in claim 1, wherein a flow passage width of said inner fin is not greater than 1.5 mm.

15. The stacked type cooler as defined in claim 1, wherein a height of said inner fin is within a range of 1 to 5 mm.

16. The stacked type cooler as defined in claim 1, wherein a thickness of said inner fin is smaller than a thickness of said first and second tube walls.

17. The stacked type cooler as defined in claim 1, wherein a thickness of said inner fin is within a range of 0.03 to 1.0 mm.

18. The stacked type cooler as defined in claim 1, wherein a thickness of said first and second tube walls is within a range of 0.1 to 5.0 mm.

19. The stacked type cooler as defined in claim 1, wherein said connecting pipe is a bellows tube capable of extension and contraction in a communication direction and is so constituted as to be capable of changing a gap between said cooling tubes.

20. The stacked type cooler as defined in claim 1, wherein said outside cooling tube has said coolant flow passage formed in one stage in a direction of thickness of said cooling tube, and the coolant flow passage formed in said outside cooling tube and the first coolant flow passage formed in said inside cooling tube have mutually the same sectional area.

21. The stacked type cooler as defined in claim 1, wherein a thickness of an outside tube wall of said outside cooling tube on which said electronic component is not arranged and is not in contact is greater than a thickness of other tube walls.

22. The stacked type cooler as defined in claim 21, wherein said outside tube wall has a thickness of at least 1 mm.

23. The stacked type cooler as defined in claim 1, wherein a cooling capacity on a side of said first coolant flow passage and a cooling capacity on a side of said second coolant flow passage are different.

24. The stacked type cooler as defined in claim 23, wherein the cooling capacity on the side of said first coolant flow passage and the cooling on the side of said second coolant flow passage are made different by making a flow rate of the coolant of said first coolant flow passage different from a flow rate of the coolant of said second coolant flow passage.

25. The stacked type cooler as defined in claim 1, which further includes a cylindrical connecting pipe for connecting the inlet side of the coolant of said cooling tubes adjacent to each other, and wherein an insertion hole into which said cylinder portion of said connecting pipe is inserted is formed in said cooling tube, an intermediate wall arranged in said coolant flow passage divides said coolant flow passage into a first coolant flow passage and a second coolant flow passage aligned with each other in the stacking direction of said cooling tubes, an intermediate wall hole for communicating said first coolant flow passage with said second coolant flow passage is formed in said intermediate wall at a position facing said insertion hole and an inner diameter (D1) of said cylinder portion and an inner diameter (D2) of said intermediate wall hole are different.

26. The stacked type cooler as defined in claim 25, wherein the inner diameter (D2) of said intermediate wall hole is greater than the inner diameter (D1) of said cylinder portion.

27. The stacked type cooler as defined in claim 1, which further includes a cylindrical connecting pipe for connecting an inlet side of the coolant in said cooling tubes adjacent to each other, and wherein an insertion hole, into which said cylinder portion of said connecting pipe is inserted, is formed in said cooling tube, an intermediate wall arranged in said coolant flow passage divides said coolant flow passage into a first coolant flow passage and a second coolant flow passage aligned with each other in the stacking direction of said cooling tubes, an intermediate wall hole for communicating said first coolant flow passage with said second coolant flow passage is formed in said intermediate wall at a position facing said insertion hole, said cylinder portion protrudes from said insertion hole into said coolant flow passage, and a projection length (L1) of said cylinder portion on the side of said first coolant flow passage is different from a projection length (L2) of said cylinder portion on the side of said second coolant flow passage.

28. The stacked type cooler as defined in claim 1, wherein heat exchange performance of said fin inside said first coolant flow passage is different from heat exchange performance of said fin inside said second coolant flow passage.

29. The stacked type cooler as defined in claim 1, wherein one of the electronic components is disposed in a position corresponding to the upper stream side inner fin and another one of the electronic components is disposed in a position corresponding to the lower stream side inner fin.

* * * * *